(12) United States Patent
Yoshida et al.

(10) Patent No.: US 6,317,361 B2
(45) Date of Patent: Nov. 13, 2001

(54) SEMICONDUCTOR MEMORY CAPABLE OF DETECTING DEFECTIVE DATA IN THE MEMORY CELLS THEREOF

(75) Inventors: Takuji Yoshida; Kenichi Watanabe, both of Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/761,148

(22) Filed: Jan. 17, 2001

(30) Foreign Application Priority Data

Jan. 19, 2000 (JP) .................................................. 12-014004

(51) Int. Cl.$^7$ ................................................. G11C 16/06
(52) U.S. Cl. ................................ 365/185.09; 365/185.21; 365/185.22
(58) Field of Search .......................... 365/185.03, 185.09, 365/185.21, 185.22, 185.23, 200, 230.06

(56) References Cited

U.S. PATENT DOCUMENTS

| 5,638,320 | | 6/1997 | Wong et al. | 365/185.03 |
|---|---|---|---|---|
| 5,748,526 | * | 5/1998 | Lee | 365/185.09 |
| 5,835,426 | * | 11/1998 | Koura | 365/200 |
| 5,966,330 | * | 10/1999 | Tang et al. | 365/185.2 |
| 6,188,603 | * | 2/2001 | Takeda | 365/185.09 |
| 6,236,591 | * | 5/2001 | Pockrandt | 365/185.09 |

* cited by examiner

*Primary Examiner*—Son Mai
(74) *Attorney, Agent, or Firm*—Junichi Mimura

(57) ABSTRACT

A semiconductor memory capable of detecting defective data in the memory cells thereof is presented. In the memory, the defective data is detected by applying a word-line voltage, which is less than the minimum threshold voltage of memory cells. Further, when a memory cell at the address N has a defective data, a memory cell at the address N−1 is output as the data of the memory cell at the address N.

11 Claims, 11 Drawing Sheets

SEMICONDUCTOR MEMORY CAPABLE OF DETECTING DEFECTIVE DATA IN THE MEMORY CELLS THEREOF

CROSS-REFERENCE TO RELATED APPLICATION

This application claims the priority benefit of Japanese Patent Application No. 2000-014004, filed Jan. 19, 2000, the entire disclosure of which is incorporated herein by reference.

BACKGROUND OF THE INVENTION

1. Field of the Invention

The invention relates to a semiconductor memory for storing analog signals in memory cells. Specifically, the semiconductor memory can detect defective data in the memory cells, and then compensate the defective data, and finally output the analog signal with very little noise.

2. Description of the Related Art

Non-volatile memory, such as EEPROM and flash EPROM storing analog signals, is disclosed in U.S. Pat. No. 5,638,320. Such a non-volatile memory stores the analog signals that correspond to respective one of data writing threshold voltages Vrt of memory cell transistors. The analog signal stored in one memory cell is read out (or restored) by measuring a threshold voltage of the memory cell transistor. The relationship between the threshold voltage of the memory cell transistor and the analog signal is shown in FIG. 11. The threshold voltages Vt of memory cell transistors storing analog signals are n a range between a minimum read-out voltage Vrtmin and a maximum read-out voltage Vrtmax, which is higher than an initial threshold voltage Vtint. The initial threshold voltage Vtint means a threshold voltage of a memory cell during the erase. The analog signal is stored by controlling precisely the amount of charge to be injected onto the floating gate of the memory cell transistor. Channel-hot-electron-injection is generally used to write an analog signal in the memory cell.

FIG. 12 shows a relationship between a saturation threshold voltage Vrt of the memory cell transistor and a total accumulated write time, when control gate voltage Vpp is changed in the range of 8v~13v during the data writing operation of the flash EPROM. By changing the control gate voltage Vpp, the amount of charge in the floating gate is changed. As a result, a saturation threshold voltage Vst of the memory cell is changed. When the Channel-hot-electron-injection is used, the higher the control gate voltage Vpp, the higher the saturation threshold voltage Vst.

On some occasions, even if these non-volatile memories are used in an electronic product, the charge stored in the memory cell may leaks accidentally. This phenomenon is called a "data holding characteristic defect" (hereinafter referred to as "defective data"). When a memory cell containing defective data is selected to be read out, an analog signal having a minimum voltage, which is not the analog signal to be read out, is read out. For example, when the memory cell at the address N has defective data, and analog signals having high voltages are stored in the memory cells at the addresses N−1 and N+1, which precede or follow the address N, a large distortion is included on the waveform of the analog signal outputted.

SUMMARY OF THE INVENTION

An objective of the invention is to provide a semiconductor memory in which detection of defective data in the memory cells is possible, and in which it is possible then to compensate the defective data and finally output the analog signal without distortion on its waveform.

These objectives are achieved by providing a semiconductor memory including a plurality of memory cells storing data, each cell having a different threshold voltage that is set in a range between a minimum read-out voltage and a maximum read-out voltage, a gate voltage generating circuit applying a first voltage, which is less than the minimum read-out voltage to the gate of the memory cells when a data read-out operation is started, and a sense amplifier applying a first signal to the gate voltage generating circuit when data in the memory cell is read out by the first voltage, and applying a second signal to the gate voltage generating circuit when data in the memory cell is not read out by the first voltage, whereby it is determined that the defective data is stored in the memory cell when the first signal is outputted from the sense amplifier.

Further, these objectives are achieved by providing a semiconductor memory decried above further including the characteristic that the gate voltage generating circuit increases the first voltage when the gate voltage generating circuit receives the second signal.

Moreover, these objectives are achieved by providing a semiconductor memory decried above further including the characteristic that the output from the sense amplifier is changed from the first signal to the second signal when the memory cell is read-out by the increased first voltage, and wherein the gate voltage generating circuit halts the increase the first voltage by receiving the first signal and outputs a voltage as a threshold voltage of the memory cell at the time that the increase is halted.

Furthermore, these objectives are achieved by providing a semiconductor memory decried above further including the characteristic that the plurality of memory cells includes a first memory cell having a first analog signal, which is accessed to read out in a first cycle and a second memory cell having a second analog signal, which is accessed to read out in a second cycle, and a voltage holding circuit holding a increased voltage as a first threshold voltage when the first memory cell is read-out by the increased first voltage in the first cycle, and refusing to hold the first voltage when the second memory cell is read-out by the first voltage in the second cycle and maintaining the first threshold voltage of the first cycle in the second cycle and an analog signal output circuit outputting analog signals, which correspond to the voltages held in the voltage holding circuit.

BRIEF DESCRIPTION OF THE DRAWINGS

The invention will be more particularly described with reference to the accompanying drawings in which.

DETAILED DESCRIPTION OF THE PREFERRED EMBODIMENTS

Figure 1:
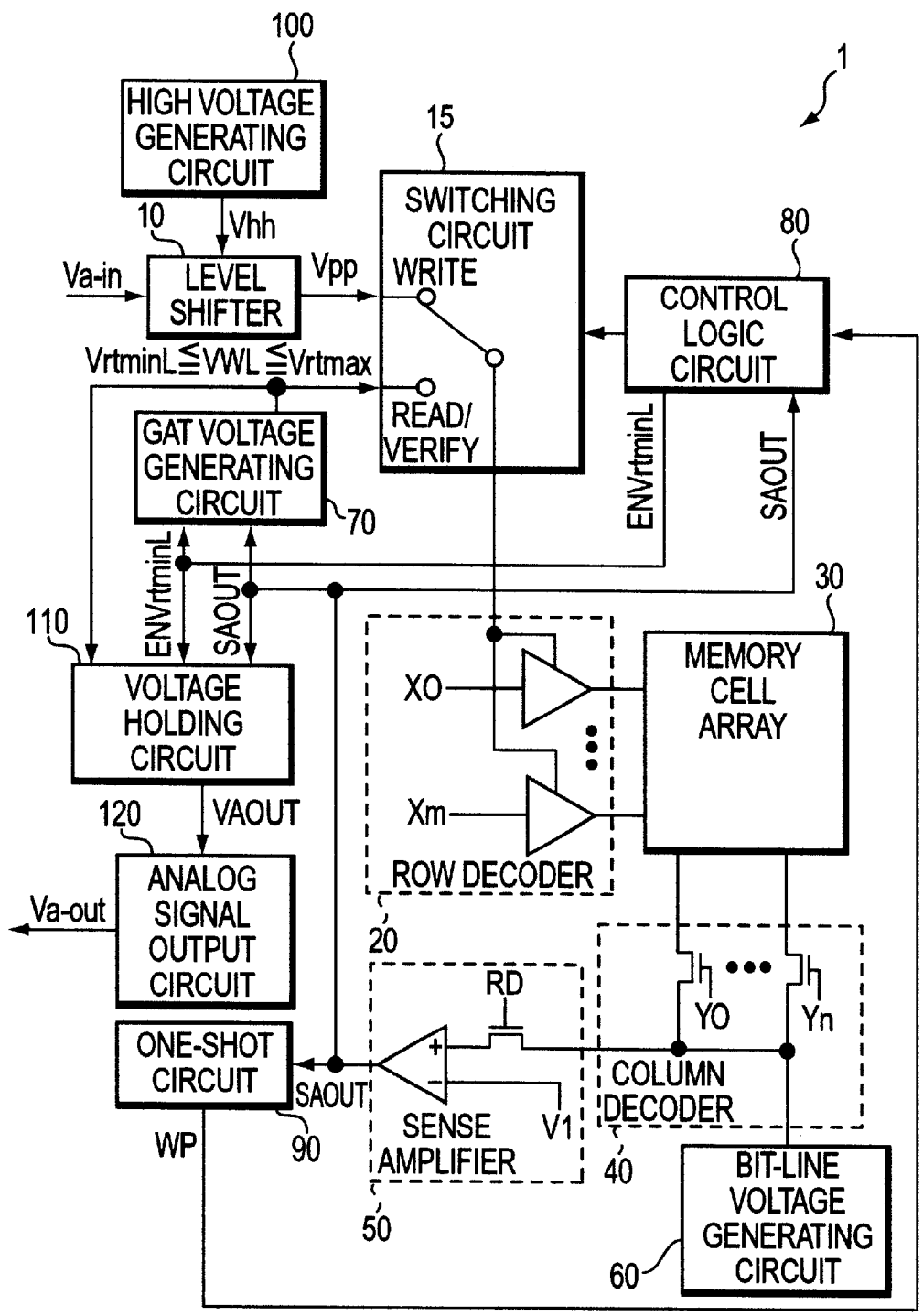
FIG. 1 is a circuit diagram of a flash memory according to a first embodiment of the invention.

Referring to FIG. 1, a flash memory 1 according to a first embodiment of the invention includes a level shifter 10, a switching circuit 15 for selecting one of two operation modes, a row decoder 20, a memory cell array 30, a column decoder 40, a sense amplifier 50, a bit-line voltage generating circuit 60, a gate voltage generating circuit 70 for reading data, a control logic circuit 80, a one-shot circuit 90, a high voltage generating circuit 100, a voltage holding circuit 110, and an analog signal output circuit 120.

The level shifter 10 transforms an analog input signal Va-in to a control gate voltage Vpp, which corresponds to the analog signal Va-in, one-to-one. The level shifter 10 provides the control gate voltage Vpp to the switching circuit 15.

The gate-voltage switching circuit 15 selects the control gate voltage Vpp outputted from the level shifter 10 during the data writing operation, and selects a control gate voltage VWL (word-line voltage) outputted from the gate voltage generating circuit 70 during the data read-out operation or a data verifying operation. Then, the switching circuit 15 provides a selected control gate voltage Vpp or VWL to the row decoder 20.

The row decoder 20 controls control gates of memory cell transistors in the memory cell array 30. The bit-line voltage generating circuit 60 provides a bit-line voltage during the data writing operation to the memory cell array 30 through the column decoder 40. The control logic circuit 80 outputs an enable signal ENVrtminL to the gate voltage generating circuit 70 to show whether the data read-out operation has started. The one-shot circuit 90 outputs a signal WP indicating a completion of the data writing operation to the control logic circuit 80. The high voltage generating circuit 100 provides a maximum voltage Vhh of the control gate voltage Vpp to the level shifter 10 during the data writing operation. The analog signal output circuit 120 outputs the analog output signal Va-out, which correspond to an analog signal VAOUT stored temporarily in the voltage holding circuit 110.

Figure 2:
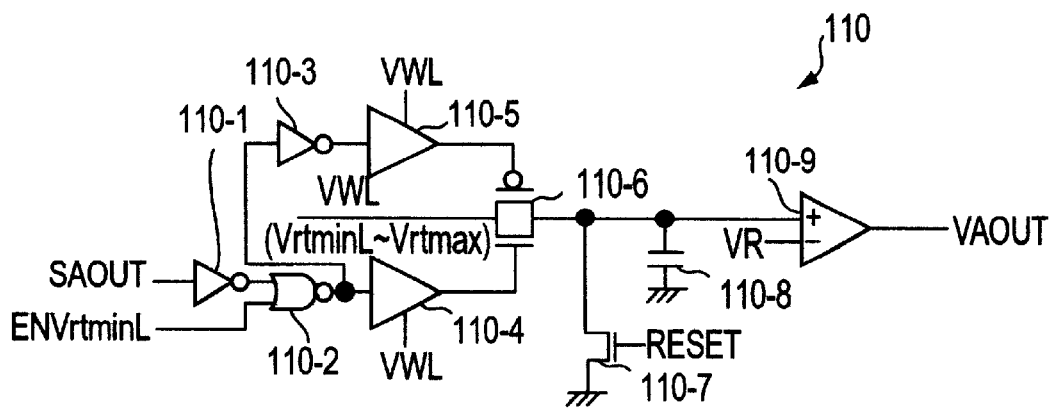
FIG. 2 is a circuit diagram of a voltage holding circuit in the flash memory of FIG. 1.

The voltage holding circuit 110 temporarily stores the analog signal VAOUT, which corresponds to the threshold voltage Vt of the memory cell transistor selected to be read out. As shown in FIG. 2, the voltage holding circuit 110 includes a first inverter 110-1, a NOR gate 110-2, a second inverter 110-3, a first level shifter 110-4, a second level shifter 110-5, a transfer gate 110-6, a transistor 110-7, a capacitor 110-7, and comparator 110-9.

The NOR gate 110-2 receives an output signal SAOUT from the sense amplifier 50 through the first inverter 110-1 at one of two input terminals, and receives the enable signal ENVrtminL outputted from the control logic circuit 80 at the other terminal. The output terminal of the NOR gate 110-2 is commonly connected to the input terminal of the second inverter 110-3 and the input terminal of the first level shifter 110-4. The output terminal of the second inverter 110-3 is connected to the input terminal of the second level shifter 1104. The outputs of the first and the second level shifters 110-4 and 110-5 are connected to a first and a second control terminal of the transfer gate 110-6, respectively.

The transfer gate 110-6 provides the word-line voltage VWL outputted from the gate voltage generating circuit 70 to a noninverting terminal (denote "+") of the comparator 110-9 when the output of the level shifter 110-4 is at an H level and the output of the level shifter 110-5 is at an L level. On the other hand, the transfer gate 110-6 is closed to reject the passage of the word-line voltage VWL when the output of the level shifter 110-4 is at an L level and the output of the level shifter 110-5 is at an H level. Thus, the word-line voltage VWL is not transferred to the noninverting terminal ("+") of the comparator 110-9 in this condition.

The noninverting terminal ("+") of the comparator 110-9 is also connected to a drain terminal of the transistor 110-7 and one end of the capacitor 110-8. A source terminal of the transistor 110-7 and the other end of the capacitor 110-8 are commonly connected to ground GND. The transistor 110-9 is controlled by a reset signal RESET, and the noninverting terminal ("+") of the comparator 110-9 is connected to ground GND when the reset signal is inputted to a gate of the transistor 110-9. Further a reference voltage VR is applied to an inverting terminal (denote "−") of the comparator 110-9.

The data writing operation and the data read-out operation of the flash memory 1 are explained below. Here, FN (Fowler Nordheimt) tunnel current is used to erase data.

Figure 3:
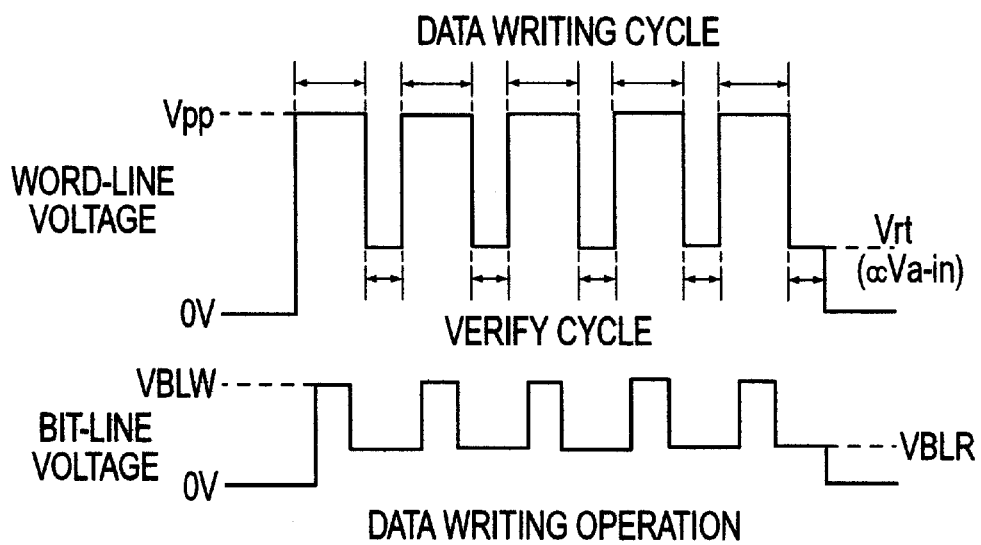
FIG. 3 is a timing chart showing the data writing operation of the flash memory of FIG. 1.

First, the data writing operation is explained. As shown in FIG. 3, data writing cycles and data verifying cycles, which monitor the threshold voltage of the memory cell transistor, are performed repeatedly in the data writing operation. During the data writing cycles, the level shifter 10 generates the control gate voltage Vpp, which corresponds to the analog input signal Va-in, from the maximum voltage Vhh, which is provided from the high voltage generating circuit 100, and then, applies it to the switching circuit 15. The switching circuit 15 selects the control gate voltage Vpp provided from the level shifter 10, and then, applies it to the row decoder 20. Then, the row decoder 20 selects a memory cell (called "selected memory cell") of the memory cell array 30, in which data is stored, and then, provides the control gate voltage Vpp to a word line that is connected to the selected memory cell.

The column decoder 40 provides a bit-line voltage VBLW for writing data outputted from the bit-line voltage generating circuit 60 to a bit line BL, which is connected to the selected memory cell. The bit-line voltage VBLW is set at 6V, which is enough to generate hot electrons. Hot electrons are injected into a floating gate of the selected memory cell transistor in order to increase a threshold voltage Vt of the selected memory cell.

After a few periods, which are necessary to write data, have passed, a bit-line voltage VBLR for reading data (less than 1.5v) is applied to the bit line BL, which is connected to the selected memory cell, and then, the verifying cycle is performed.

During the verifying cycle, the gate voltage generating circuit 70 outputs word-line voltage VWL, which is adjusted to the same voltage level as the threshold voltage Vt, which corresponds to the analog input signal Va-in, to the switch circuit 15. The switch circuit 15 selects the word-line voltage VWL, and then applies it to the row recorder 20. Then, the row decoder applies the word-line voltage VWL to the word line WL, which is connected to the selected memory cell.

Then, the data stored in the selected memory cell is read out by the sense amplifier 50. When the threshold voltage Vt of the selected memory cell reaches a desired voltage level Vtt, the sense amplifier 50 provides the output signal SAOUT at the H level to the gate voltage generating circuit 70, the control logic circuit 80, the one-shot circuit 90 and the voltage holding circuit 110. When the one-shot circuit 90 receives such signal SAOUT at the HL level, it applies a signal WP indicating a completion of data writing to the control logic circuit 80. Thus, by receiving the signal WP, the control logic circuit 80 recognizes that the data writing operation has been completed.

When the threshold voltage Vt of the selected memory cell does not reach the desired voltage level Vtt, the sense amplifier 50 provides the output signal SAOUT at the L level to the gate voltage generating circuit 70, the control logic circuit 80, the one-shot circuit 90 and the voltage holding circuit 110. When the one-shot circuit 90 receives such signal SAOUT at the L level, it does not provide the signal WP, which indicates a completion of data writing, to the control logic circuit 80. Thus, the control logic circuit 80 recognizes that the data writing operation should be performed again. Then, the data writing cycle and the verifying cycle are repeated until the threshold voltage Vt of the selected memory cell reaches the desired voltage level Vtt.

Next, the data read-out operation of the flash memory 1 according the first embodiment is explained. The threshold voltage Vt of the transistor of the selected memory cell reaches the desired voltage Vtt, which corresponds to the analog input signal Va-in. The threshold voltage Vt of the transistor of the selected memory is, therefore, set in the range of Vrtmin (minimum writing threshold voltage) ~Vrtmax (maximum writing threshold voltage) by the control gate voltage Vpp in the data writing operation. The data read-out operation is performed by detecting the threshold voltage Vt of the transistor of the selected memory cell.

Figure 4:
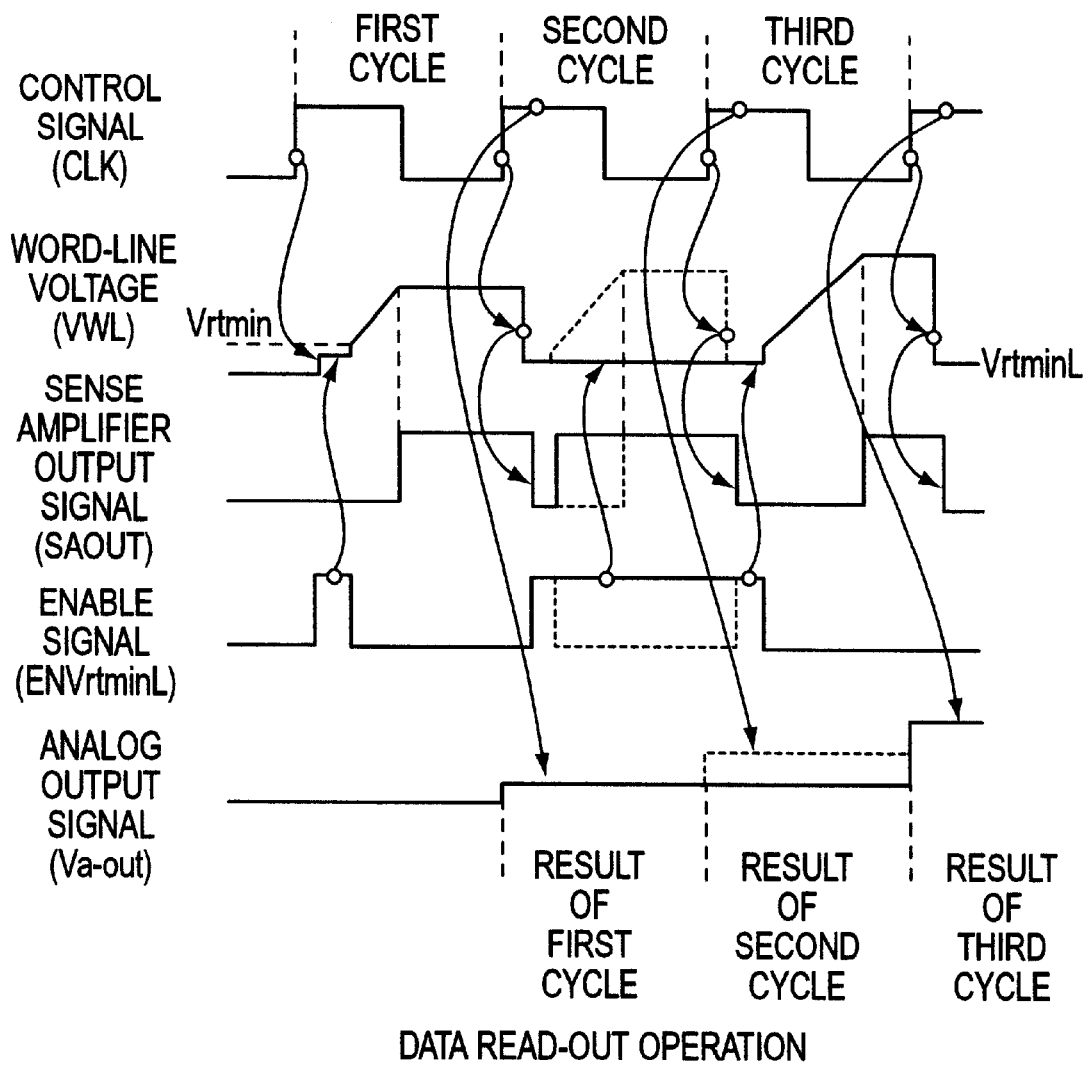
FIG. 4 is a timing chart showing the data read-out operation of the flash memory of FIG. 1.

FIG. 4 shows a timing chart of the data read-out operation. In each clock signal in the chart, the solid line shows an operation in case that defective data is recovered, and the broken line shows an operation in case that the selected cell is in normal condition.

When the data read-out operation is started, the control logic circuit 80 outputs the active enable signal ENVrtminL (H Level) to the gate voltage generating circuit 70 and the voltage holding circuit 110. Then, the gate voltage generating circuit 70 outputs the word-line voltage VWL, which is set to the voltage VrtminL, to the switching circuit 15 and the voltage holding circuit 110. The voltage VrtminL is lower than the minimum writing threshold voltage Vrtmin, and is greater than or equal to the initial threshold voltage Vtint.

The switching circuit 15 applies the word-line voltage VWL (set at VrtminL) from the gate voltage generating circuit 70 to the word line WL, which is connected to the selected memory cell in the memory cell array 30, through the row decoder 20. Since the word-line voltage VWL (VrtminL) is lower than the threshold voltage Vt of the selected memory cell in which data is stored, the selected memory cell is in an offstate when the selected memory cell is in normal condition (Namely, a sufficient charge amount is stored in the selected memory cell). Thus, an inactive signal SAOUT (L level) indicating that the selected memory cell contains no defective data, is outputted from the sense amplifier 50, which is connected to the memory cell array 30, through the column decoder 40. When the control logic circuit 80 receives the inactive signal SAOUT, the output signal ENVrtminL of the control logic circuit 80 is changed from active to inactive (H→L). When the gate voltage generating circuit 70 receives the inactive enable signal ENVrtminL, the word-line voltage VWL from the gate voltage generating circuit 70 is increased linearly from the minimum writing threshold voltage Vrtmin to the maximum writing threshold voltage Vrtmax within a particular period.

During this period, the sense amplifier 50 performs the data read-out operation. That is, the sense amplifier 50, which is connected to the bit line BL of the selected memory cell, detects the threshold voltage Vt of the selected memory cell.

While the word-line voltage VWL is lower than the threshold voltage Vt of the selected memory cell transistor, the selected memory cell transistor is in an off-state. Thus, the output signal SAOUT of the sense amplifier 50 is maintained at the L Level. While the output signal SAOUT is maintained at the L Level, the word-line voltage VWL of the gate voltage generating circuit 70 is continuously increased toward the maximum writing threshold voltage Vrtmax.

When the increased word-line voltage VWL becomes equal to the threshold voltage of the selected memory cell transistor, the selected memory cell turns on. Thus, the sense amplifier 50 inverts the output signal SAOUT from the L level to the H level. When the gate voltage generating circuit 70 receives the output signal SAOUT at the H level, the increase of the word-line voltage VWL is halted, and then, the word-line voltage VWL is maintained at its current value.

The word-line voltage VWL from the gate voltage generating circuit 70 and the output signal SAOUT from the sense amplifier 50 are applied to the voltage holding circuit 110. In the voltage holding circuit 110, the transfer gate 110-6 is opened to pass the word-line voltage VWL to the capacitor 110-8 when the output signal SAOUT is at the H level and the enable signal ENVrtminL is at the L level, and the transfer gate 110-6 is closed when the output signal SAOUT is at the L level. Therefore, the word-line voltage VWL is not held at the capacitor 110-8 in this condition.

The analog signal output circuit 120 stores the analog signal VAOUT, which is held at the capacitor 110-8 in the voltage holding circuit 110, by synchronizing with a predetermined control signal, such as a clock signal CLK, and outputs the analog output signal Va-out, which corresponds to the analog signal VAOUT. The first cycle of the data read-out operation is now completed.

As described above, when the second data read-out cycle is started after the first read-out cycles has been completed, the circuits of the flash memory 1 except for the analog signal output circuit 120 repeat the same operation as in the first cycles. The analog signal output circuit 120 outputs continuously the analog output signal Vaout corresponding to the analog signal VAOUT of the first cycle until the analog signal output circuit 120 is instructed to output another analog output signal Va-out corresponding to another analog signal VAOUT in the second cycle.

Figure 11:
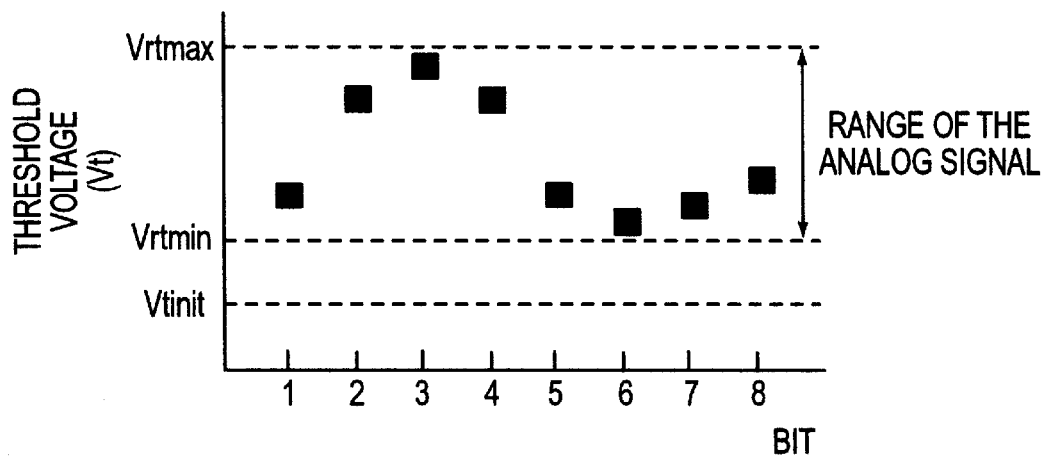
FIG. 11 shows a relationship in the related art between a threshold voltage of a memory cell transistor and an analog signal.
Figure 12:
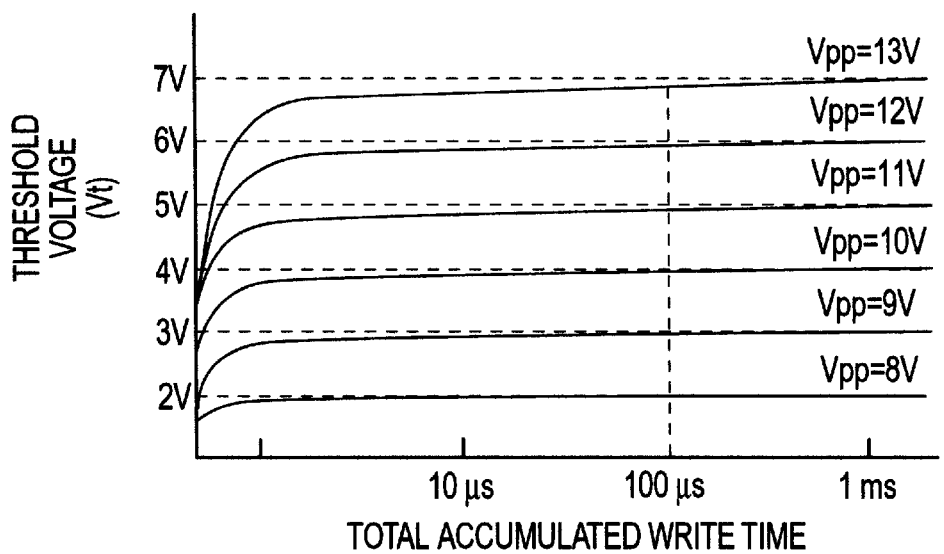
FIG. 12 shows a relationship between a threshold voltage of the memory cell transistor and a total accumulated write time when control gate voltage Vpp is changed within the range of 8v~13v during the data writing operation of the flash EPROM.

As further described above, the data read-out operation is performed by changing the word-line voltage VWL. When all selected memory cells are in normal conditions, the sequence of the analog output signal Va-out contains no dramatic level change because the threshold voltages of the memory cells at the address N−1, N, N+1, which are next to each other, are close to each other (Refer to FIG. 11).

As described in the related art, when the charge stored in the memory cell leaks (namely, when the memory cell having the defective data is selected), noise may be added to the analog output signal Va-out. However, according to the flash memory 1 of the first embodiment of the invention, even if the charge stored in the memory cell leaks, the analog output signal Va-out having little noise can be outputted because of reasons described below. In the following description, the data read-out operation is explained when the charge stored in the memory cell leaks so that the threshold voltage Vt of the selected memory cell transistor drops to less than the minimum writing threshold voltage Vrtmin. Specifically, the following description is focused on the situation that a first memory cell, which is selected in a first cycle, contains no defective data, a second memory cell, which is selected in a second cycle, has defective data, and a third memory cell, which is selected in a third cycle, contains no defective data.

Since the first memory cell contains no defective data during the first cycle, an analog voltage, which corresponds to the threshold voltage Vrt of the first memory cell, is held on the capacitor 110-8 of the voltage holding circuit 110. When the second cycle is started, the gate voltage generating circuit 70 upon receiving the enable signal ENVrtminL outputs the word-line voltage VWL (set as VrtminL) to the switch circuit 15, as well as in the first cycle performed previously. The word-line voltage VWL is applied to the control gate of the selected memory cell (second memory cell) in the memory cell array 30 via the switching circuit 15 and the row decoder 20. Since the threshold voltage Vt of the selected memory cell is less than the voltage VrtminL because of the leakage of the charge, the selected memory cell turns on by the voltage VrtminL. Thus, the sense amplifier outputs the signal SAOUT at the H level, which indicates that the second memory is read out.

When the gate voltage generating circuit 70 receives the signal SAOUT at the H level, the gate voltage generating circuit 70 holds the word-line voltage VWL at the voltage VrtminL. Further, when the control logic circuit 80 receives the signal SAOUT at the H level, the control logic circuit 80 does not invert the enable signal ENVrtminL from the H level to the L level. That is, the enable signal ENVrtminL is maintained at the H level.

Then, the enable signal ENVrtminL at the H level is applied to the voltage holding circuit 110. Since the enable signal ENVrtminL is at the H level, the transfer gate 110-6 maintains an off-state. Thus, since the enable signal ENVrtminL indicating the active level (the H level) is inputted to the voltage holding circuit 110 even if the sense amplifier 50 outputs the signal SAOUT indicating that the second memory cell is read out. Therefore, the word-line voltage VWL is not passed through the transfer gate 110-6, and the analog voltage that was charged in the first cycle is still stored in the capacitor 110-8.

In synchronizing with a control signal (Clock signal CLK), the analog signal output circuit 120 holds the analog signal VAOUT, which was held in the voltage holding circuit 110 in the first cycle, as the data of the selected memory cell in the second cycle, and outputs the analog output signal Va-out, which corresponds to the analog signal. Accordingly, in the flash memory 1 of the first embodiment, the analog output signal Va-out outputted in the first cycle again is outputted in the second cycle.

In the third read-out cycle, the third memory cell containing no defective data is selected. Thus, an analog output signal Va-out, which corresponds to the stored analog input signal Va-in, is outputted from the analog signal output circuit 120 correctly.

According to the first embodiment, the flash memory 1 can detect whether or not the selected memory cell has defective data by applying the voltage VrtminL, which is lower than the minimum writing threshold voltage Vrtmin and greater than the initial threshold voltage Vtint, to the control gate of the transistor of the selected memory cell in the data read-out operation. Further, when the selected memory cell containing defective data is detected, the analog signal that is read out in the previous cycle is held in the capacitor 110-8 and then, the analog output signal Va-out that corresponds to this analog signal in the previous cycle is outputted as a result of the data read-out operation of the current cycle. Thus, when a memory cell containing defective data is selected, the existence of the defective data in the selected memory cell can be detected, and as a result, an analog output signal Va-out having very little noise can be outputted.

Figure 5A:
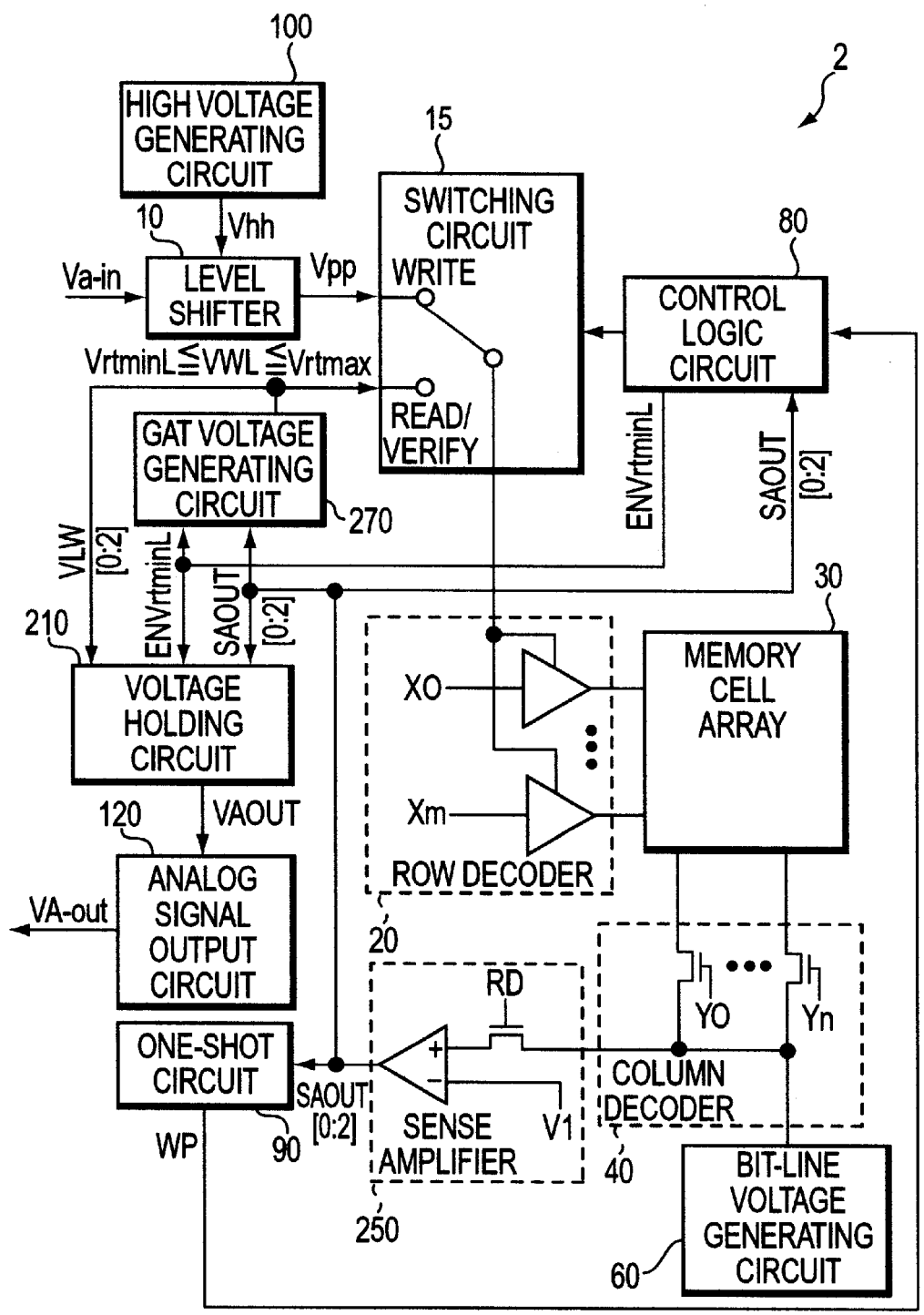
FIG. 5A is a circuit diagram of a flash memory according to a second embodiment of the invention.

Referring to FIG. 5A, a flash memory 2 according to a second embodiment of the invention is illustrated. In the flash memory 2, when data stored in a memory cell at an address N is read out, data stored in memory cells at addresses N−1 and N+1 also can be read out in one cycle. In contrast to the flash memory 1 of the first embodiment, the flash memory 2 includes a sense amplifier 250 as a replacement for the sense amplifier 50 of the first embodiment, a gate voltage generating circuit 270 for reading data as a replacement for the gate voltage generating circuit 70 of the first embodiment, and a voltage holding circuit 210 as a replacement for the voltage holding circuit 110 of the first embodiment.

The sense amplifier 250 includes three sense amplifiers identical to the sense amplifier 50, connected in parallel. The gate voltage generating circuit 270 includes three gate voltage generating circuits identical to the gate voltage generating circuit 70, connected in parallel. The voltage holding circuit 210 includes three voltage holding sub-circuits $210_{N-1}$, $210_N$, $210_{N+1}$ identical to the voltage holding circuit 110, connected in parallel. Thus, a transfer line of a word-line voltage VWL, which is outputted from the gate voltage generating circuit 270, has three-bit lines. Moreover, a transfer line of a signal SAOUT, which is outputted from the sense amplifier 250, has three-bit lines for signals $SAOUT_N$, $SAOUT_{N-1}$ and $SAOUT_{N+1}$.

Figure 6:
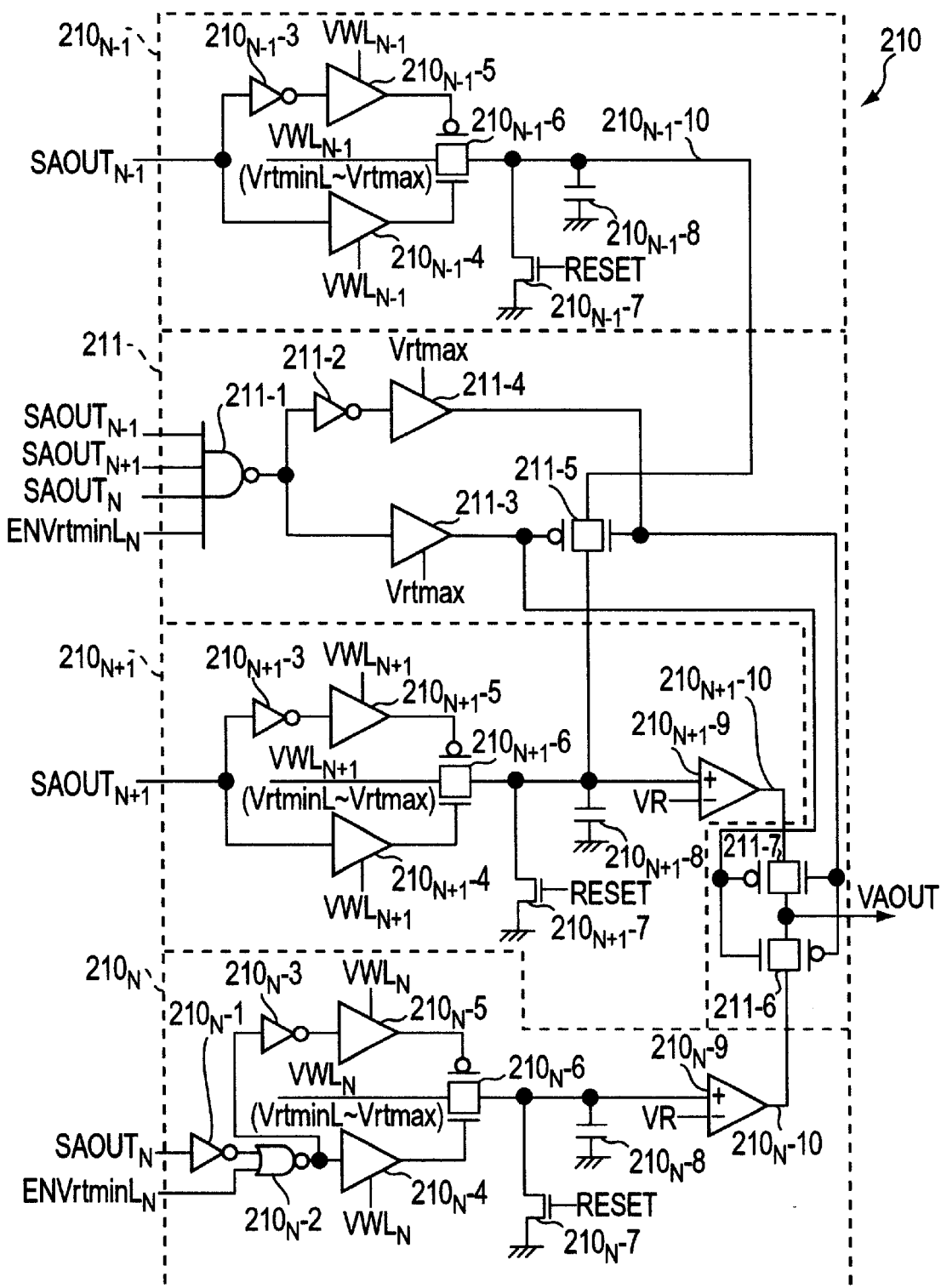
FIG. 6 is a circuit diagram of a voltage holding circuit in the flash memory of FIG. 5.

Referring to FIG. 6, the voltage holding circuit 210 further includes a select circuit 211. The first sub-circuits $210_N$, which corresponds to the address N, includes a first inverter $210_N$-1 a NOR gate $210_N$-2, a second inverter $210_N$-3, a first level shifter $210_N$-4, a second level shifter $210_N$-5, a transfer gate $210_N$-6, a transistor $210_N$-7, a capacitor $210_N$-8 and comparator $210_N$-9.

The NOR gate $210_N$-2 receives an output signal $SAOUT_N$ from the sense amplifier 250 through the first inverter $210_N$-1 at one of two input terminals, and receives an enable signal $ENVrtminL_N$ outputted from the control logic circuit 80 at the other terminal. The output terminal of the NOR gate $210_N$-2 is commonly connected to the input terminal of the second inverter $210_N$-3 and the input terminal of the first level shifter $210_N$-4. The output terminal of the second inverter $210_N$-3 is connected to the input terminal of the second level shifter $210_N$-5. The outputs of the first and the second level shifters $210_N$-4 and $210_N$-5 are connected to a first and a second control terminal of the transfer gate $210_N$-6, respectively.

The transfer gate $210_N$-6 provides the word-line voltage $VWL_N$ outputted from the gate voltage generating circuit 270 to a noninverting terminal (denote "+") of the comparator $210_N$-9 when the output of the first level shifter $210_N$-4 is at an H level and the output of the second level shifter $210_N$-5 is at an L level. On the other hand, the transfer gate $210_N$-6 is in an off-state when the output of the first level shifter $210_N$-4 is at an L level and the second output of the level shifter $210_N$-5 is at an H level. Thus, the word-line voltage $VWL_N$ is not transferred to the noninverting terminal ("+") of the comparator $210_N$-9 in this condition.

The noninverting terminal ("+") of the comparator $210_N$-9 is also connected to a drain terminal of the transistor $210_N$-7 and one end of the capacitor $210_N$-8. A source terminal of the transistor $210_N$-7 and the other end of the capacitor $210_N$-8 are commonly connected to ground GND. The transistor $210_N$-7 is controlled by a reset signal RESET, and the noninverting terminal ("+") of the comparator $210_N$-9 is connected to ground GND when the resent signal is inputted to a gate of the transistor $210_N$-9. Further a reference voltage VR is applied to an inverting terminal (denote "−") of the comparator $210_N$-9. An output terminal of the comparator $210_N$-9 is connected to an output node $210_N$-10.

The second sub-circuits $210_{N+1}$, which corresponds to the address N+1, includes an inverter $210_{N+1}$-3, a first level shifter $210_{N+1}$-4, a second level shifter $210_{N+1}$-5, a transfer gate $210_{N+1}$-6, a transistor $210_{N+1}$-7, a capacitor $210_{N+1}$-8 and comparator $210_{N+1}$-9

The inverter $210_{N+1}$-3 and the first level shifter $210_{N+1}$-4 receive an output signal $SAOUT_{N+1}$ from the sense amplifier 250. The output terminal of the inverter $210_{N+1}$-3 is connected to the input terminal of the second level shifter $210_{N+1}$-5. The outputs of the first and the second level shifters $210_{N+1}$-4 and $210_{N+1}$-5 are connected to a first and a second control terminal of the transfer gate $210_{N+1}$-6, respectively.

The transfer gate $210_N$-6 provides the word-line voltage $VWL_{N+1}$ outputted from the gate voltage generating circuit 270 to a noninverting terminal ("+") of the comparator $210_{N+1}$-9 when the output of the first level shifter $210_{N+1}$-4 is at an H level and the output of the second level shifter $210_{N+1}$ 5 is at an L level. On the other hand, the transfer gate $210_{N+1}$-6 is in an off-state when the output of the first level shifter $210_{N+1}$-4 is at an L level and the output of the second level shifter $210_{N+1}$-5 is at an H level. Thus, the word-line voltage $VWL_{N+1}$ is not transferred to the noninverting terminal ("+") of the comparator $210_{N+1}$-9 in this condition.

The noninverting terminal ("+") of the comparator $210_{N+1}$-9 is also connected to a drain terminal of the transistor $210_{N+1}$-7 and one end of the capacitor $210_{N+1}$-8. A source terminal of the transistor $210_{N+1}$-7 and the other end of the capacitor $210_{N+1}$-8 are commonly connected to ground GND. The transistor $210_{N+1}$-7 is controlled by the reset signal RESET, and the noninverting terminal ("+") of the comparator $210_{N+1}$-9 is connected to ground GND when the resent signal is inputted to a gate of the transistor $210_{N+1}$-9. Further the reference voltage VR is applied to an inverting terminal ("−") of the comparator $210_{N+1}$-9. An output terminal of the comparator $210_{N+1}$-9 is connected to an output node $210_{N+1}$-10.

The third sub-circuits $210_{N+1}$, which corresponds to the address N−1, includes an inverter $210_{N-}$-3, a first level shifter $210_{N-1}$-4, a second level shifter $210_{N-1}$-5, a transfer gate $210_{N-1}$-6, a transistor $210_{N-}$-7, and a capacitor $210_{N-1}$-8.

The inverter $210_{N-1}$-3 and the first level shifter $210_{N-1}$-4 receive an output signal $SAOUT_{N-1}$ from the sense amplifier 250 The output terminal of the inverter $210_{N-1}$-3 is connected to the input terminal of the second level shifter $210_{N-1}$-4. The outputs of the first and the second level shifters $210_{N-1}$-4 and $210_{N-1}$-5 are connected to a first and a second control terminal of the transfer gate $210_{N-1}$-6, respectively.

The transfer gate $210_{N-1}$-6 provides the word-line voltage $VWL_{N-1}$ outputted from the gate voltage generating circuit 270 to an output node $210_{N-1}$-10 when the output of the first level shifter $210_{N-1}$-4 is at an H level and the output of the second level shifter $210_{N-1}$-5 is at an L level. On the other hand, the transfer gate $210_{N-1}$-6 is in an off-state when the output of the first level shifter $210_{N-1}$-4 is at an L level and the output of the second level shifter $210_{N-1}$-5 is at an H level. Thus, the word-line voltage $VWL_{N-1}$ is not transferred to the output node $210_{N-1}$-10 in this condition.

The output node $210_{N-1}$-10 is also connected to a drain terminal of the transistor $210_{N-1}$-7 and one end of the capacitor $210_{N-1}$-8. A source terminal of the transistor $210_{N-1}$-7 and the other end of the capacitor $210_{N-1}$-8 are commonly connected to ground GND. The transistor $210_{N-}$1-7 is controlled by the reset signal RESET, and the ground potential is applied to the output node $210_{N-}$-10 when the reset signal RESET is applied to the transistor $210_{N-1}$-7.

The select circuit 211 includes a 4-input NAND gate 211-1, an inverter 2111-2, a first level shifter 211-3, a second level shifter 21-4, a first transfer gate 211-5, a second transfer gate 211-6, and a third transfer gate 211-7. The 4-input NAND gate 211-1 receives the enable signal ENVrtminLN from the control logic circuit 80 at its first input terminal, the signal SAOUT from the sense amplifier 250 at its second input terminal, the signal $SAOUT_{N+1}$ from the sense amplifier 250 at its third input terminal, and the signal $SAOUT_{N-1}$ from the sense amplifier 250 at its fourth input terminal. The output terminal of the 4-input NAND gate 211-1 is commonly connected to the input terminal of the inverter 211-2 and the input terminal of the first level shifter 211-3.

The output of the first level shifters 211-3 is connected to a second control terminal (P-type) of the first transfer gate 211-5, a first control terminal (N-type) of the second transfer gate 211-6, and a second control terminal (P-type) of the third transfer gate 211-7, commonly. The output of the second level shifters 211-4 is connected to a first control terminal (N-type) of the first transfer gate 211-5, a second control terminal (P-type) of the second transfer gate 211-6, and a first control terminal (N-type) of the third transfer gate 211-7, commonly.

The first transfer gate 211-5 electrically connects the output node $210_{N-1}$-10 of the third sub-circuit $210_{N-1}$ to the noninverting terminal ("+") of the comparator $210_{N+1}$-9 of the second sub-circuit $210_{N+1}$ when the output of the first level shifter 211-3 is at an L level and the output of the second level shifter 211-4 is at an H level. On the contrary, the first transfer gate 211-5 electrically disconnects the output node $210_{N-1}$-10 of the third sub-circuit $210_{N-1}$ to the noninverting terminal ("+") of the comparator $210_{N-1}$-9 of the second sub-circuit $210_{N+1}$ when the output of the first level shifter 211-3 is at the H level and the output of the second level shifter 211-4 is at the L level.

The operation of the second and third transfer gates 211-6, 211-7 is complementary. That is, the second transfer gate 211-6 turns on and the third transfer gate turns off when the output of the first level shifter 211-3 is at the H level and the output of the second level shifter 211-4 is at the L level. In this operation, the voltage holding circuit 210 provides the analog signal VAOUT from the first sub-circuit $210_N$ as its output to the analog signal output circuit 120. On the contrary, the second transfer gate 211-6 turns off and the third transfer gate turns on when the output of the first level shifter 211-3 is at the L level and the output of the second level shifter 211-4 is at the H level. In this operation, the voltage holding circuit 210 provides the analog signal VAOUT from the second sub-circuit $210_{N+1}$ as its output to the analog signal output circuit 120.

Figure 5B:
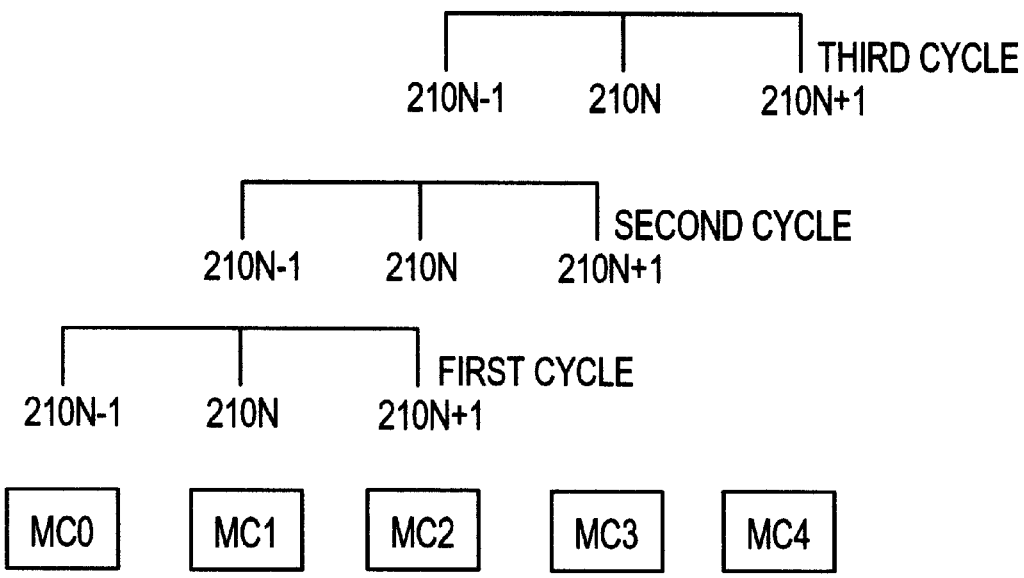
FIG. 5B shows a concept of the data read-out operation according to a second embodiment.

The read-out operation of the flash memory 2 according to the second embodiment is explained below. Since the data writing operation and the data erasing operation of the flash memory 2 are the same as the operations of the flash memory 1 in the first embodiment, the description of them is omitted. Before the detail explanation of the data read-out operation is explained, a brief concept of the operation is explained with reference to FIG. 5B. When a first memory cell MC1 is selected, a memory cell MC0 and a second memory cell MC2 are also accessed in the first cycle, wherein it is considered that the first memory cell MC1 is at the address N, the memory MC0 is at the address N−1 and the second memory cell MC2 is at the address N+1. When the second memory cell MC2 is selected, the first memory cell MC1 and a third memory cell MC3 are also accessed in the second cycle, wherein it is considered that the second memory cell MC2 is at the address N, the first memory MC1 is at the address N−1 and the third memory cell MC3 is at the address N+1. When a third memory cell MC3 as the is selected, the second memory cell MC2 and a memory cell MC4 are also accessed in the third cycle, wherein it is considered that the third memory cell MC3 is at the address N, the second memory MC2 is at the address N−1 and the memory cell MC4 is at the address N+1. That is, the memory cells, which precede or follow the selected memory cell, are accessed with the selected memory cell in the same cycle.

The threshold voltage Vt of a transistor of a selected memory cell reaches a desired voltage Vtt, which corresponds to an analog input signal Va-in, and the threshold voltage Vt of the transistor of the selected memory is set in the range of Vrtmin (minimum writing threshold voltage) ~Vrtmax (maximum writing threshold voltage) by the control gate voltage Vpp in the data writing operation.

Figure 7:
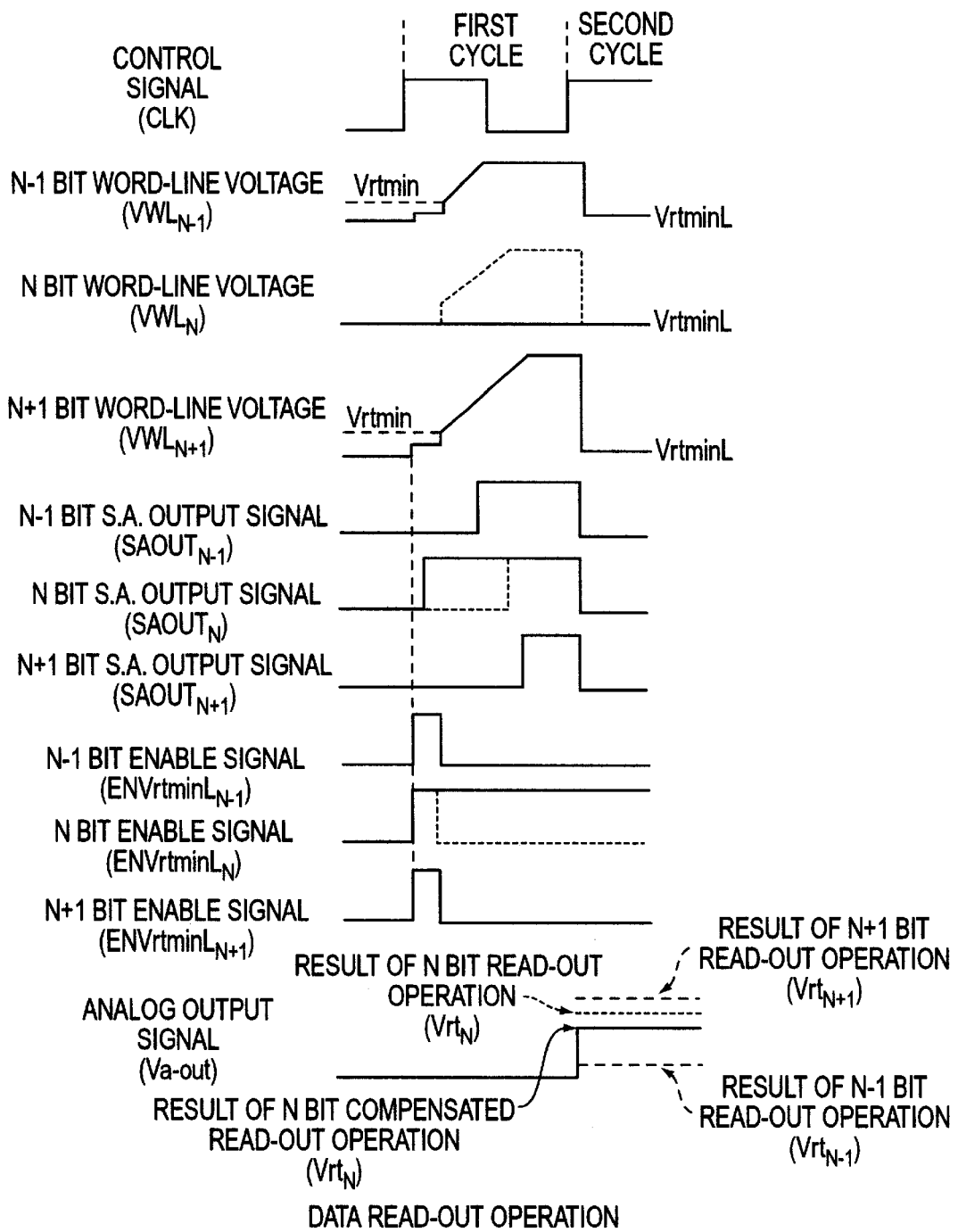
FIG. 7 is a timing chart showing the data read-out operation of the flash memory of FIG. 5.

FIG. 7 shows a timing chart of the data read-out operation of the selected memory at the address N. In each clock signal in the chart, the solid line shows an operation in case that defective data is recovered, and the broken line shows an operation in case that the selected cell is in normal condition.

When the data read-out operation is started, the control logic circuit 80 outputs an active enable signal $ENVrtminL_N$ (H Level) to the gate voltage generating circuit 270 and the voltage holding circuit 210. Then, the gate voltage generating circuit 270 outputs the word-line voltage VWL, which is set to the voltage VrtminL, to the switching circuit 15 and the voltage holding circuit 210. The voltage VrtminL is lower than the minimum writing threshold voltage Vrtmin, and is greater than or equal to the initial threshold voltage Vtint.

The switching circuit 15 applies the word-line voltage VWL (set at VrtminL) to the word line WL, which is connected to the selected memory cell in the memory cell array 30, through the row decoder 20. Since the word-line voltage VWL (VrtminL) is lower than the threshold voltage Vt of the selected memory cell in which data is stored, the selected memory cell is in an off-state when the selected memory cell contains no defective data (namely, a sufficient charge amount is stored in the selected memory cell). Thus, an inactive signal SAOUT (L level) indicating that the selected memory cell contains no defective data is outputted from the sense amplifier 250, which is connected to the memory cell array 30, through the column decoder 40. When the control logic circuit 80 receives the inactive signal SAOUT, the condition of the output signal ENVrtminL of the control logic circuit 80 is changed from active to inactive (H→L). When the gate voltage generating circuit 270 receives the inactive enable signal ENVrtminL, the word-line voltage VWL from the gate voltage generating circuit 270 is increased linearly from the minimum writing threshold voltage Vrtmin to the maximum writing threshold voltage Vrtmax within a particular period.

During this period, the sense amplifier 250 performs the data read-out operation. That is, the sense amplifier 250, which is connected to the bit line BL of the selected memory cell, detects the threshold voltage Vt of the selected memory cell.

While the word-line voltage VWL is lower than the threshold voltage Vt of the selected memory cell transistor, the selected memory cell transistor is in an off-state. Thus, the output signal SAOUT of the sense amplifier 250 is maintained at the L Level. While the output signal SAOUT is maintained at the L Level, the word-line voltage VWL of the gate voltage generating circuit 270 is continuously increased toward the maximum writing threshold voltage Vrtmax.

When the increased word-line voltage VWL becomes equal to the threshold voltage of the selected memory cell transistor, the selected memory cell turns on. Thus, the sense amplifier 250 inverts the output signal SAOUT from the L level to the H level. When the gate voltage generating circuit 270 receives the output signal SAOUT at the H level, the increase of the word-line voltage VWL is halted, and then, the word-line voltage VWL is maintained at its current value.

The word-line voltage VWL from the gate voltage generating circuit 270 and the output signal SAOUT from the sense amplifier 250 are applied to the voltage holding circuit 210. In the voltage holding circuit 210, the transfer gate $210_N$-6 is opened to pass the word-line voltage VWL to the capacitor $210_N$-8 when the output signal SAOUT is at the H level and the enable signal ENVrtminL is at the L level, and the transfer gate $210_N$-6 is closed when the output signal SAOUT is at the L level. Therefore, the word-line voltage VWL is not held at the capacitor $210_N$-8 in this condition.

At this time, the threshold voltages of the memory cells at the addresses N−1 and N+1, as well as the threshold voltage of the selected memory cell at the address N, are held in the voltage holding circuit 210. When the memory cell at the address N contains no defective data, the third transfer gate 211-7 of the select circuit 211 turns off, and the second transfer gate 211-6 turns on. Thus, the analog signal VAOUT, which corresponds to the signal $SAOUT_N$, is outputted to the analog signal output circuit 120. The analog signal output circuit 120 stores the analog signal VAOUT, which is held at the capacitor $210_N$-8 in the first sub circuit $210_N$, by synchronizing with a predetermined control signal, such as a clock signal CLK, and outputs the analog output signal Va-out, which corresponds to the analog signal VAOUT. The data read-out operation at the address N is now completed.

The foregoing description explains the data read-out operation in the case that the selected memory cell at the address N contains no defective data. However, the following description relates to the data read-out operation when the selected memory cell at the address N has defective data. That is, the first memory, containing no defective data, is selected in the first cycle, then the second memory, containing defective data, is selected and then, the third memory cell, containing no defective data, is selected in the third cycle.

Therefore, in the first cycle, the threshold voltage of the first memory cell corresponds to the address N, and then it is stored in the capacitor $210_N$-8. The threshold voltages of the memory cells, which precede or follow the first memory cell correspond to the addresses N−1 and N+1, and the threshold voltage of the memory cell, which precedes the first memory cell, is stored in the capacitor $210_{N-1}$-8 if the memory cell, which precedes the first memory cell, contains no defective data.

In the second cycle, the threshold voltage of the second memory cell corresponds to the address N, and then, it is stored in the capacitor $210_N$-8. The threshold voltages of the memory cells (the first and the third memory cells), which precede or follow the second memory cell, correspond to the addresses N−1 and N+1, and they are stored in the capacitors $210_{N-1}$-8 and $210_{N+1}$-8, respectively.

In the third cycle, the threshold voltage of the third memory cell corresponds to the address N, and then, it is stored in the capacitor $210_N$-8. The threshold voltages of the memory cells, which precede or follow the third memory cell, correspond to the addresses N−1 and N+1, and the threshold voltage of the memory cell, which follows the third memory cell, is stored in the capacitor $210_{N-1}$-8 if the memory cell, which follows the third memory cell, contains no defective data.

In the first cycle, since the first memory cell contains no defective data, the threshold voltage of the first memory cell is correctly stored in the capacitor $210_N$, and the threshold voltage stored in the capacitor $210_N$ is selected by the select circuit 211, and is outputted.

Next, the data read-out operation of the second memory cell in the second cycle is explained below. Since the selected memory cell (second memory cell) at the address N has defective data, the transfer gate $210_N$-5 is closed. Thus, the capacitor $210_N$-8 of the voltage holding circuit 210 does not hold the voltage, which corresponds to the data in normal condition to be stored in the selected memory cell. At the capacitor $210_N$-8, the threshold voltage of the first memory cell is held continuously. On the contrary, since the data in the first and the second memory cells at addresses N−1 and N+1 are read out correctly, the capacitors $210_{N-1}$-8, $210_{N+1}$-8 hold the threshold voltages, which correspond to the data in normal condition to be stored in the first and the second memory cells, respectively.

When the selected memory cell at the address N has defective data, the enable signal $ENVrtminL_N$ is at the H level. Therefore, when the data read-out operation from the memory cells at the addresses N−1, N and N+1 has been completed, the first transfer gate 211-5 turns on. By turning the first transfer gate 211-5 on, the capacitor $210_{N-1}$-8 is connected to the capacitor $210_{N+1}$-8.

A voltage $Vrt_{N'}$ (called "dummy analog signal"), which is generated by the connection between the capacitors $210_{N-1}$-8, $210_{N+1}$-8, is calculated according to the following formula, where the voltage stored in the capacitor $210_{N-1}$-8 is $Vrt_{N-1}$, and the voltage stored in the capacitor $210_{N+1}$-8 is $Vrt_{N+1}$. Here, an electrostatic capacity $C_{N-1}$ of the capacitor $210_{N-1}$-8 equals the electrostatic capacity $C_{N+1}$ of the capacitor $210_{N+1}$-8, and therefore, both are called "$C_N$".

$$Vrt_{N'}=(C_{N-1}\times Vrt_{N-1}+C_{N+1}\times Vrt_{N+1})/(C_{N-1}+C_{N+1})=C_N\times(Vrt_{N-1}+Vrt_{N+1})/(2\times C_N)=(Vrt_{N-1}+Vrt_{N+1})/2$$

When the selected memory cell at the address N has defective data, the third transfer gate 211-7 in the voltage holding circuit 210 turns on, and the second transfer gate 211-6 turns off. Thus, the voltage holding circuit 210 generates the analog signal VAOUT based on the dummy analog signal $Vrt_{N'}$ instead of the voltage $Vrt_N$ that is held at the capacitor $210_N$-8. That is, the dummy analog signal $Vrt_{N'}$ is considered the threshold voltage of the selected memory cell at the address N (second memory cell). Then, this analog signal VAOUT is outputted to the analog signal output circuit 120. The analog signal output circuit 120 stores the analog signal VAOUT from the voltage holding circuit 210 by synchronizing with a predetermined control signal, such as a clock signal CLK, and outputs the analog output signal Va-out, which corresponds to the analog signal VAOUT The second cycle of the data read-out operation is now completed.

According to the flash memory 2 of the second embodiment, as well as the flash memory 1 of the first embodiment, the flash memory 2 can detect whether or not the selected memory has defective data by applying the voltage VrtminL, which is lower than the minimum writing threshold voltage Vrtmin and greater than the initial threshold voltage Vtint, to the control gate of the transistor of the selected memory cell in the data read-out operation. Furthermore, according to the flash memory 2, when the data in the memory cell at the address N is read out, the data in the memory cells in the addresses N−1, N+1 also are read out. Thus, it is possible to generate the dummy analog signal, which is approximately equal to the voltage to be stored in the memory cell at the address N, from the threshold voltages of the memory cells at the addresses N−1, N+1. Therefore, according to the second embodiment, even if the selected memory cell at the address N has defective data, the existence of the defective data can be detected, and as a result, an analog output signal Va-out having very little noise can be outputted because the dummy analog signal, as the threshold voltage of the selected memory cell, is generated from the threshold voltages of the memory cells at the addresses N−1, N+1, which precede or follow the address N.

Figure 8B:
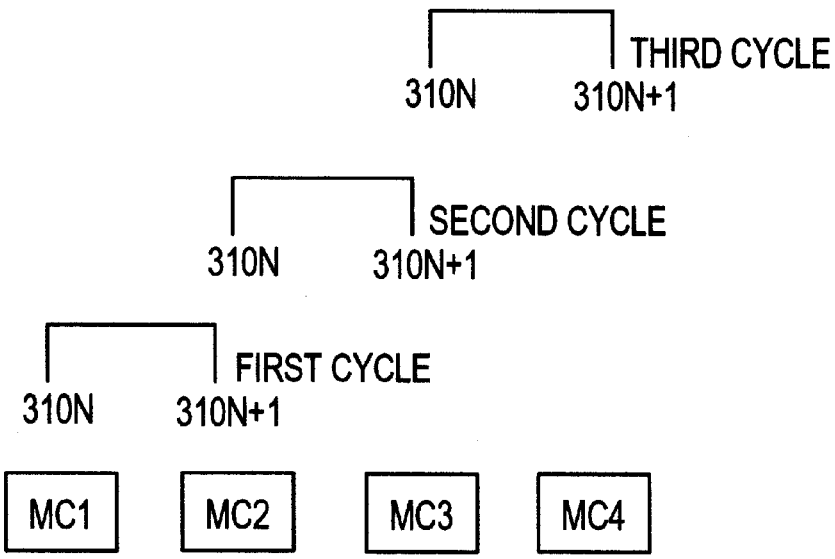
FIG. 8B shows a concept of the data read-out operation according to a third embodiment.
Figure 8A:
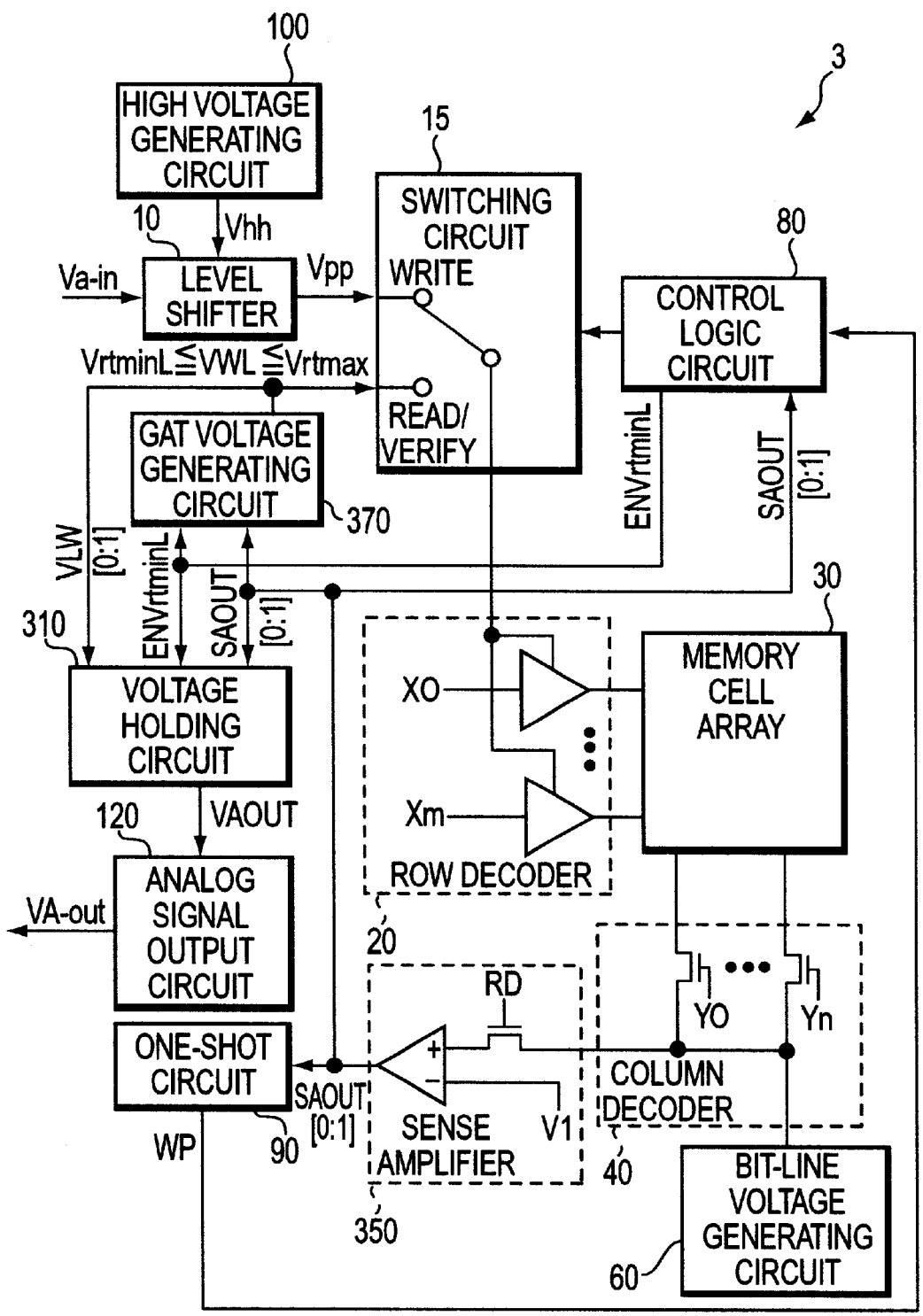
FIG. 8A is a circuit diagram of a flash memory according to a third embodiment of the invention.

Referring to FIG. 8A, a flash memory 3 according to a third embodiment of the invention is illustrated. In the flash memory 3, when data stored in a memory cell at an address N is read out, data stored in memory cell at address N+1, which follows the address N, also can be read out. In contrast to the flash memory 1 of the first embodiment, the flash memory 3 includes a sense amplifier 350 as a replacement for the sense amplifier 50 of the first embodiment, a gate voltage generating circuit 370 for reading data as a replacement for the gate voltage generating circuit 70 of the first embodiment, and a voltage holding circuit 310 as a replacement for the voltage holding circuit 110 of the first embodiment.

The sense amplifier 350 includes two sense amplifiers identical to the sense amplifier 50, connected in parallel. The gate voltage generating circuit 370 includes two gate voltage generating circuits identical to the gate voltage generating circuit 70, connected in parallel. The voltage holding circuit 310 includes two voltage holding sub-circuits $310_N$, $310_{N+1}$ identical to the voltage holding circuit 110, connected in parallel. Thus, a transfer line of a word-line voltage VWL, which is outputted from the gate voltage generating circuit 370, has two-bit lines. Moreover, a transfer line of a signal SAOUT, which is outputted from the sense amplifier 350, has two-bit lines for signals $SAOUT_N$ and $SAOUT_{N+1}$.

Figure 9:
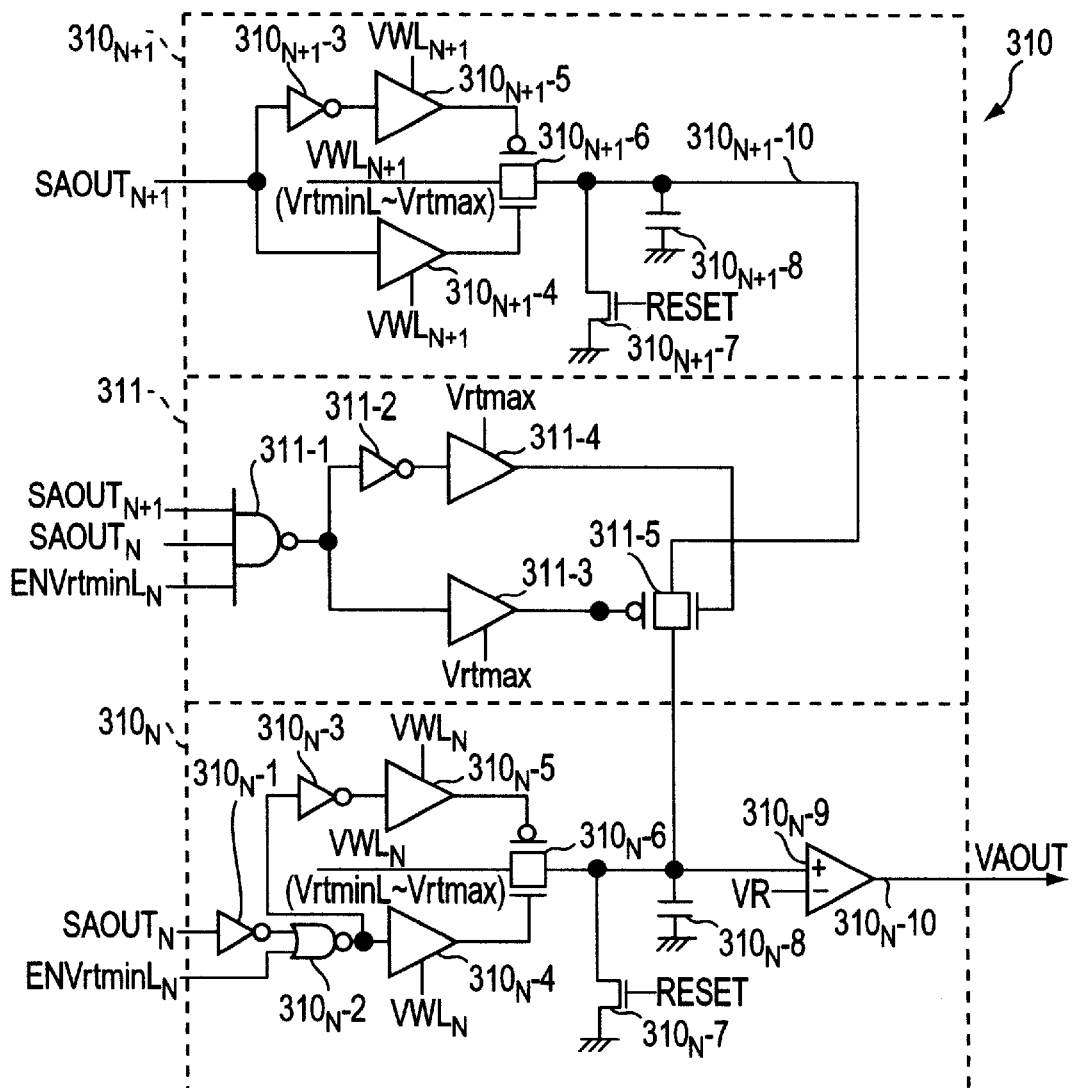
FIG. 9 is a circuit diagram of a voltage holding circuit in the flash memory of FIG. 8.

Referring to FIG. 9, the voltage holding circuit 310 further includes a select circuit 311. The first sub-circuit $310_N$, which corresponds to the address N, includes a first inverter $310_N$-1 a NOR gate $310_N$-2, a second inverter $310_N$-3, a first level shifter $310_N$-4, a second level shifter $310_N$-5, a transfer gate $310_N$-6, a transistor $310_N$-7, a capacitor $310_N$-8 and comparator $310_N$-9

The NOR gate $310_N$-2 receives an output signal $SAOUT_N$ from the sense amplifier 350 through the first inverter $310_N$-1 at one of two input terminals, and receives an enable signal $ENVrtminL_N$ outputted from the control logic circuit 80 at the other terminal. The output terminal of the NOR gate $310_N$-2 is commonly connected to the input terminal of the second inverter $310_N$-3 and the input terminal of the first level shifter $310_N$-4. The output terminal of the second inverter $310_N$-3 is connected to the input terminal of the second level shifter $210_N$-5. The outputs of the first and the second level shifters $210_N$-4 and $210_N$-5 are connected to a first and a second control terminal of the transfer gate $210_N$-6, respectively.

The transfer gate $310_N$-6 provides the word-line voltage $VWL_N$ outputted from the gate voltage generating circuit 370 to a noninverting terminal (denote "+") of the comparator $310_N$-9 when the output of the first level shifter $310_N$-4 is at an H level and the output of the second level shifter $310_N$-5 is at an L level. On the other hand, the transfer gate $310_N$-6 is closed when the output of the first level shifter $310_N$-4 is at an L level and the second output of the level shifter $310_N$-5 is at an H level. Thus, the word-line voltage $VWL_N$ is not transferred to the noninverting terminal ("+") of the comparator $310_N$-9 in this condition.

The noninverting terminal ("+") of the comparator $310_N$-9 is also connected to a drain terminal of the transistor $310_N$-7 and one end of the capacitor $310_N$-8. A source terminal of the transistor $310_N$-7 and the other end of the capacitor $310_N$-8 are commonly connected to ground GND. The transistor $310_N$-7 is controlled by a reset signal RESET, and the noninverting terminal ("+") of the comparator $310_N$-9 is connected to ground GND when the resent signal is inputted to a gate of the transistor $310_N$-9. Further a reference voltage VR is applied to an inverting terminal (denote "−") of the comparator $310_N$-9. An output terminal of the comparator $310_N$-9 is connected to an output node $310_N$-10. The voltage holding circuit 310 outputs an analog signal VAOUT to an analog signal output circuit 120 from the output node $310_N$-10.

The second sub-circuits $310_{N+1}$, which corresponds to the address N+1, includes an inverter $310_{N+1}$-3, a first level shifter $310_{N+1}$-4, a second level shifter $310_{N+1}$-5, a transfer gate $310_{N+1}$-6, a transistor $310_{N+1}$-7, and a capacitor $310_{N+1}$-8.

The inverter $310_{N+1}$-3 and the first level shifter $310_{N+1}$-4 receive an output signal $SAOUT_{N+1}$ from the sense amplifier 350. The output terminal of the inverter $310_{N+1}$-3 is connected to the input terminal of the second level shifter $310_{N+1}$-5 The outputs of the first and the second level shifters $310_{N+1}$-4 and $310_{N+1}$-5 are connected to a first and a second control terminal of the transfer gate $310_{N+1}$-6, respectively.

The transfer gate $310_N$-6 provides the word-line voltage $VWL_{N+1}$ outputted from the gate voltage generating circuit 370 to an output node $310_{N+1}$-10 when the output of the first level shifter $310_{N+1}$-4 is at an H level and the output of the second level shifter $310_{N+1}$ 5 is at an L level. On the other hand, the transfer gate $310_{N+1}$-6 is closed when the output of the first level shifter $310_{N+1}$-4 is at an L level and the output of the second level shifter $310_{N+1}$-5 is at an H level. Thus, the word-line voltage $VWL_{N+1}$ is not transferred to the output node $310_{N+1}$-10 in this condition.

The output node $310_{N+1}$-10 is also connected to a drain terminal of the transistor $310_{N+1}$-7 and one end of the capacitor $310_{N+1}$-8. A source terminal of the transistor $310_{N+1}$-7 and the other end of the capacitor $310_{N+1}$-8 are commonly connected to ground GND. The transistor $310_{N+1}$-7 is controlled by the reset signal RESET and the output node $310_{N+1}$-10 is connected to ground GND when the resent signal is inputted to a gate of the transistor $310_{N+1}$-9.

The select circuit 311 includes a 3-input NAND gate 311-1, an inverter 3111-2, a first level shifter 311-3, a second level shifter 31-4, and a transfer gate 311-5. The 3-input NAND gate 311-1 receives the enable signal $ENVrtminL_N$ from the control logic circuit 80 at its first input terminal, the signal $SAOUT_N$ from the sense amplifier 350 at its second input terminal, and the signal $SAOUT_{N+1}$ from the sense amplifier 350 at its third input terminal. The output terminal of the 3-input NAND gate 311-1 is commonly connected to the input terminal of the inverter 311-2 and the input terminal of the first level shifter 311-3. The outputs of the first level shifters 311-3 and the second transfer gate 311-6 are connected to the second control terminal (P-type) and the first control terminal (N-type) of the transfer gate 311-5, respectively.

The transfer gate 311-5 electrically connects the output node $310_{N+1}$-10 of the second sub-circuit 310 N+1to the noninverting terminal ("+") of the comparator $310_N$-9 of the first sub-circuit $310_N$ when the output of the first level shifter 311-3 is at an L level and the output of the second level shifter 311-4 is at an H level. On the contrary, the transfer gate 311-5 electrically disconnects the output node $310_{N+1}$-10 of the second sub-circuit $310_{N+1}$ to the noninverting terminal ("+") of the comparator $310_N$-9 of the first sub-circuit 310Nwhen the output of the first level shifter 311-3 is at the H level and the output of the second level shifter 311-4 is at the L level.

The read-out operation of the flash memory 3 according to the third embodiment is explained below. Since the data writing operation and the data erasing operation of the flash memory 3 are the same as the operations of the flash memory 1 in the first embodiment, the description of them is omitted. Before the detail explanation of the data read-out operation is explained, a brief concept of the operation is explained with reference to FIG. 8B. When a first memory cell MC1 is selected, a second memory cell MC2 is also accessed in the first cycle, wherein it is considered that the first memory cell MC1 is at the address N, the second memory MC2 is at the address N−1. When the second memory cell MC2 is selected, the third memory cell MC3 is also accessed in the second cycle, wherein it is considered that the second memory cell MC2 is at the address N, the third memory MC3 is at the address N−1. When a third memory cell MC3 is selected, the memory cell MC4, which follows the third memory cell, is also accessed in the third cycle, wherein it is considered that the third memory cell MC3 is at the address N, the memory MC4 is at the address N−1. That is, the memory cell, which follows the selected memory cell, is accessed with the selected memory cell in the same cycle.

The threshold voltage Vt of a transistor of a selected memory cell reaches a desired voltage Vtt, which corresponds to an analog input signal Va-in, and the threshold voltage Vt of the transistor of the selected memory is set in the range of Vrtmin (minimum writing threshold voltage) ~Vrtmax (maximum writing threshold voltage) by the control gate voltage Vpp in the data writing operation.

Figure 10:
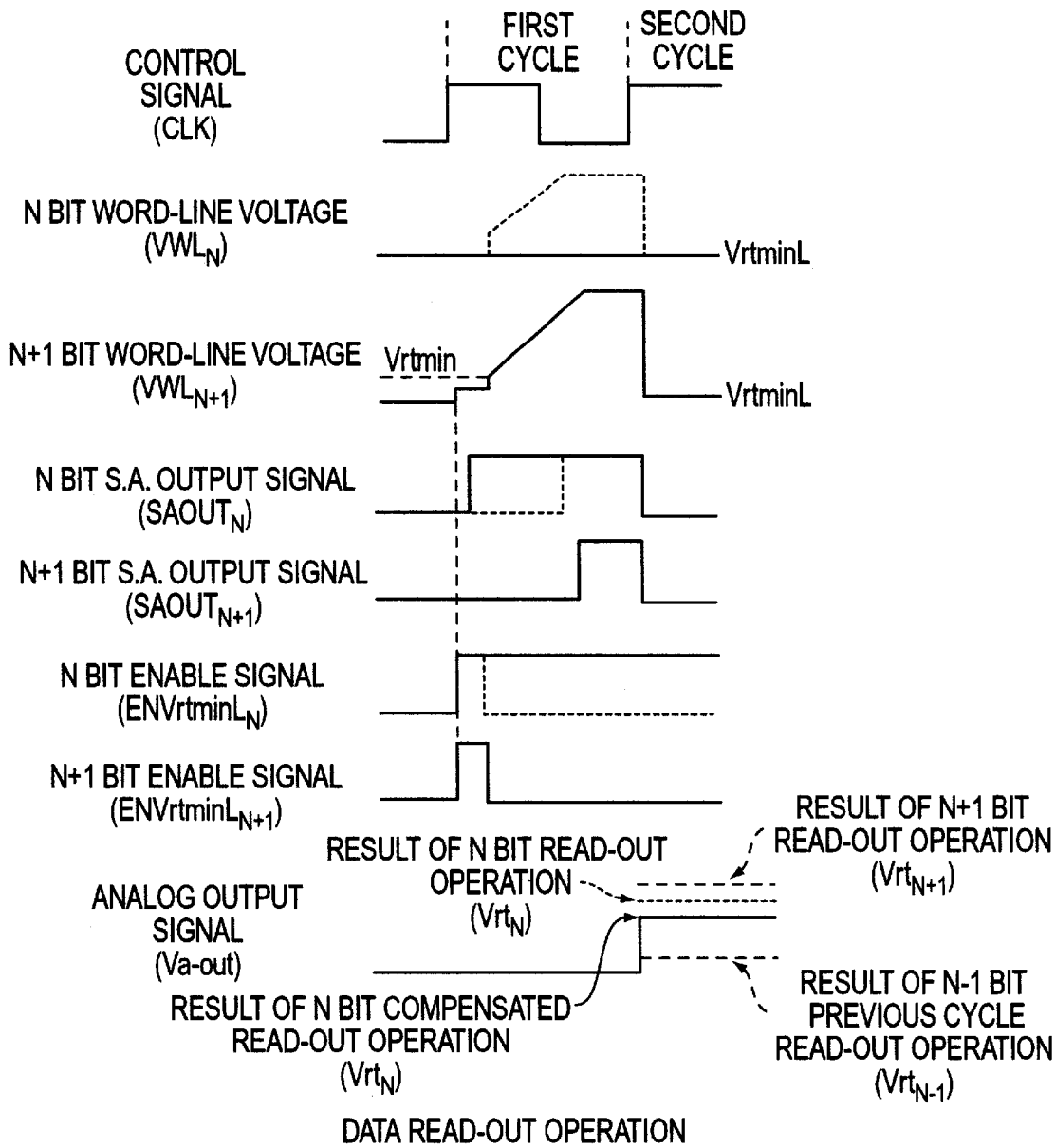
FIG. 10 is a timing chart showing the data read-out operation of the flash memory of FIG. 8.

FIG. 10 shows a timing chart of the read-out operation of the selected memory at the address N. In each clock signal in the chart, the solid line shows an operation in case that defective data is recovered, and the broken line shows an operation in case that the selected cell is in normal condition.

When the data read-out operation is started, the control logic circuit 80 outputs an active enable signal ENVrtminL$_N$ (H Level) to the gate voltage generating circuit 370 and the voltage holding circuit 310. Then, the gate voltage generating circuit 370 outputs the word-line voltage VWL, which is set to the voltage VrtminL, to the switching circuit 15 and the voltage holding circuit 310. The voltage VrtminL is lower than the minimum writing threshold voltage Vrtmin, and is greater than or equal to the initial threshold voltage Vtint.

The switching circuit 15 applies the word-line voltage VWL (set at VrtminL) to the word line WL, which is connected to the selected memory cell in the memory cell array 30, through the row decoder 20. Since the word-line voltage VWL (VrtminL) is lower than the threshold voltage Vt of the selected memory cell in which data is stored, the selected memory cell is in an off-state when the selected memory cell is in normal condition (namely, a sufficient charge amount is stored in the selected memory cell). Thus, an inactive signal SAOUT (L level) indicating that the selected memory cell contains no defective data, is outputted from the sense amplifier 350, which is connected to the memory cell array 30, through the column decoder 40. When the control logic circuit 80 receives the inactive signal SAOUT, the condition of the output signal ENVrtminL of the control logic circuit 80 is changed from active to inactive (H→L). When the gate voltage generating circuit 370 receive ENVrtminL, the word-line voltage VWL from the gate voltage generating circuit 370 is increased linearly from the minimum writing threshold voltage Vrtmin to the maximum writing threshold voltage Vrtmax within a particular period.

During this period, the sense amplifier 350 performs the data read-out operation. That is, the sense amplifier 350, which is connected to the bit line BL of the selected memory cell, detects the threshold voltage Vt of the selected memory cell.

While the word-line voltage VWL is lower than the threshold voltage Vt of the selected memory cell transistor, the selected memory cell transistor is in an off-state. Thus, the output signal SAOUT of the sense amplifier 350 is maintained at the L Level. While the output signal SAOUT from the sense amplifier 350 is maintained at the L Level, the word-line voltage VWL of the gate voltage generating circuit 370 is continuously increased toward the maximum writing threshold voltage Vrtmax.

When the increased word-line voltage VWL becomes equal to the threshold voltage of the selected memory cell transistor, the selected memory cell turns on. Thus, the sense amplifier 350 inverts the output signal SAOUT from the L level to the H level. When the gate voltage generating circuit 370 receives the output signal SAOUT at the H level, the increase of the word-line voltage VWL is halted, and then, the word-line voltage VWL is maintained at its current value.

The word-line voltage VWL from the gate voltage generating circuit 370 and the output signal SAOUT from the sense amplifier 350 are applied to the voltage holding circuit 310. In the voltage holding circuit 310, the transfer gate 310$_N$-6 is opened to pass the word-line voltage VWL to the capacitor 310$_N$-8 when the output signal SAOUT is at the H level and the enable signal ENVrtminL is at the L level, and the transfer gate 310$_N$-6 is closed when the output signal SAOUT is at the L level. Therefore, the word-line voltage VWL is not held at the capacitor 310$_N$-8 in this condition At this time, the data stored in the memory cell at the address N+1, as well as the data stored in the memory cell at the address N, is held in the voltage holding circuit 310. When the memory cell at the address N contains no defective data, the transfer gate 311-5 of the select circuit 311 turns off. Thus, the analog signal VAOUT, which corresponds to the signal SAOUT$_N$, is outputted to the analog signal output circuit 120. The analog signal output circuit 120 stores the analog signal VAOUT, which is held at the capacitor 310$_N$-8 in the first sub-circuit 310$_N$, by synchronizing with a predetermined control signal, such as a clock signal CLK, and outputs the analog output signal Va-out, which corresponds to the analog signal VAOUT. The data read-out operation at the address N is now completed.

The foregoing description explains the data read-out operation in the case that the selected memory cell at the address N contains no defective data. However, the following description relates to the data read-out operation when the selected memory cell at the address N has defective data. That is, the first memory, containing no defective data, is selected in the first cycle, then the second memory, containing defective data, is selected and then, the third memory cell, containing no defective data, is selected in the third cycle.

Therefore, in the first cycle, the threshold voltage of the first memory cell corresponds to the address N, and then it is stored in the capacitor 310$_N$-8. The threshold voltages of the second memory cell, which follows the first memory cell, correspond to the address N+1.

In the second cycle, the threshold voltage of the second memory cell corresponds to the address N. The threshold voltages of the third memory cell, which follows the second memory cell, correspond to the addresses N+1, and it is stored in the capacitor 310$_{N+1}$-8.

In the third cycle, the threshold voltage of the third memory cell corresponds to the address N, and then, it is stored in the capacitor 310$_N$-8. The threshold voltages of the memory cells, which follow the third memory cell, correspond to the address N+1, and the threshold voltage of the memory cell, which follows the third memory cell, is stored in the capacitor 210$_{N-1}$-8 if the memory cell, which follows the third memory cell, contains no defective data.

In the first cycle, since the first memory cell contains no defective data, the threshold voltage of the first memory cell is correctly stored in the capacitor 310$_N$, and the threshold voltage stored in the capacitor 310$_N$ is selected by the select circuit 311, and is outputted.

Next, the data read-out operation of the second memory cell in the second cycle is explained below. Since the selected memory cell (second memory cell) at the address N has defective data, the transfer gate 310$_N$-5 is closed. Thus, the capacitor 310$_N$-8 of the voltage holding circuit 310 does not hold the voltage, which corresponds to the data in normal condition to be stored in the selected memory cell. At the capacitor 310$_N$-8, the threshold voltage of the first memory cell is held continuously. On the contrary, since the data in the third memory cell at address N+1 is read out correctly, the capacitor 310$_{N-1}$-8 holds the threshold voltage, which corresponds to the data in normal condition to be stored in the third memory cell.

When the selected memory cell at the address N has defective data, the enable signal ENVrtminL$_N$ is at the H level. Therefore, when the data read-out operation from the memory cells at the addresses N and N+1 has been completed, the transfer gate 311-5 turns on. By turning the transfer gate 311-5 on, the capacitor 310$_N$-8 is connected to the capacitor 310$_{N-1}$-8.

A voltage Vrt$_{N''}$ (called "dummy analog signal"), which is generated by the connection between the capacitors 310$_N$-8, 310$_{N+1}$-8 is calculated according to the following formula, where the voltage stored in the capacitor 310$_N$-8 is Vrt$_{N-}$ and the voltage stored in the capacitor 310$_{N+1}$-8 is Vrt$_{N+1}$. Here, an electrostatic capacity $C_N$ of the capacitor 310$_N$-8 equals the electrostatic capacity $C_{N+1}$ of the capacitor 310$_{N+1}$-8, and therefore, both are called simply "$C_N$".

$$Vrt_{N''}=(C_N\times Vrt_{N-1}+C_{N+1}\times Vrt_{N+1})/(C_N+C_{N+1})=C_N\times(Vrt_{N-1}+Vrt_{N+1})/(2\times C_N)=(Vrt_{N-1}+Vrt_{N+1})/2$$

When the selected memory cell at the address N has defective data, the voltage holding circuit 310 generates the analog signal VAOUT based on the dummy analog signal Vrt$_{N''}$ instead of the voltage Vrt$_N$ that is held at the capacitor 310$_N$-8 That is, the dummy analog signal Vrt$_{N''}$ is considered the threshold voltage of the selected memory cell at the address N (second memory cell). Then, this analog signal VAOUT is outputted to the analog signal output circuit 120. The analog signal output circuit 120 stores the analog signal VAOUT from the voltage holding circuit 310 by synchronizing with a predetermined signal, such as a clock signal CLK, and outputs the analog output signal Va-out, which corresponds to the analog signal VAOUT The second cycle of the data read-out operation is now completed.

According to the flash memory 3 of the third embodiment, as well as the flash memory 1 of the first embodiment, the flash memory 3 can detect whether or not the selected memory has defective data by applying the voltage VrtminL, which is lower than the minimum writing threshold voltage Vrtmin and greater than the initial threshold voltage Vtint, to the control gate of the transistor of the selected memory cell in the data read-out operation. Furthermore, according to the flash memory 3, when the data in the memory cell at the address N is read out, the data in the memory cell in the address N+1 also is read out. Thus, it is possible to generate the dummy analog signal, which is approximately equal to the voltage to be stored in the memory cell, from the data at the address N in the first cycle and data at the address N+1 in the second cycle. Therefore, according to the third embodiment, even if the selected memory cell at the address N has defective data, the existence of the defective data can be detected, and as a result, an analog output signal Va-out having very little noise can be outputted, because the dummy analog signal, as the threshold voltage of the selected memory cell, is generated from the threshold voltage of the memory cell at the address N in the first cycle and the threshold voltage of the memory cell at the address N+1 in the second cycle. Moreover, since the total number of components of the flash memory 3 is less than that of the flash memory 2 of the second embodiment, it is possible to downsize a semiconductor device containing a flash memory.

While the invention has been described with reference to illustrative embodiments, this description is not intended to be construed in a limiting sense. Various other modifications of the illustrated embodiments, as well as other embodiments of the invention, will be apparent to those skilled in the art on reference to this description. Therefore, the appended claims are intended cover any such modifications or embodiments as fall within the true scope of the invention.

What is claimed:

1. A semiconductor memory, comprising:

a plurality of memory cells storing data, each cell being composed of a transistor having a floating gate and a control gate, and each transistor having a predetermined threshold voltage level that is set in a range between a minimum read-out voltage level and a maximum read-out voltage level;

a gate voltage generating circuit applying a word line signal having first or second voltage levels to the control gates of the transistors, the first voltage level being less than the minimum read-out voltage level and the second voltage level being in the range; and a sense amplifier applying a sense amplifier output signal of a third voltage level to the gate voltage generating circuit when the transistor of the memory cell is turned on by applying the word line signal of the first voltage level to its control gate, and applying the sense amplifier output signal of a fourth voltage level to the gate voltage generating circuit when the transistor of the memory cell is turned off by applying the word line signal of the first voltage level to its control gate.

2. A semiconductor memory as claimed in claim 1, wherein the gate voltage generating circuit increases the second voltage level of the word line signal when the gate voltage generating circuit receives the sense amplifier output signal of the fourth voltage level.

3. A semiconductor memory as claimed in claim 2, wherein the voltage level of the sense amplifier output signal is changed from the fourth voltage level to the third voltage level when the transistor of the memory cell is turned on by applying the increased second voltage level to its control gate, and wherein the gate voltage generating circuit halts the increase of the second voltage level of the word line signal by receiving the sense amplifier output signal having the third voltage level and outputs a voltage as a threshold voltage of the transistor at the time that the increase is halted.

4. A semiconductor memory as claimed in claim 3, wherein the plurality of memory cells includes a first memory cell having a first analog signal, which is accessed to read out in a first cycle and a second memory cell having a second analog signal, which is accessed to read out in a second cycle, further comprising:

a voltage holding circuit holding an increased voltage as a first threshold voltage when the transistor of the first memory cell is turned on by applying the increased second voltage to its control gate in the first cycle, and refusing to hold the first voltage level when the transistor of the second memory cell is turned on by applying the first voltage level to its control gate in the second cycle and maintaining the first threshold voltage of the first cycle in the second cycle; and an analog signal output circuit outputting analog signals, which correspond to the voltages held in the voltage holding circuit.

5. A semiconductor memory as claimed in claim 3, wherein the plurality memory cell includes a first memory cell having a first analog signal, which is accessed to read out in a first cycle, a second memory cell having a second analog signal, which is accessed to read out in a second cycle following the first cycle, and a third memory cell having a third analog signal, which is accessed to read out in a third cycle following the second cycle, further comprising a voltage holding circuit including a select circuit and three sub-circuits;

wherein the voltage holding circuit holds a first threshold voltage of the transistor of a selected memory cell in the memory cell array at an address N in the first sub-circuit or holds a second and a third threshold voltages of the transistors of memory cells at addresses N−1 and N+1 in the same cycle, which precede or follow the address N, in the second and the third sub-circuits; and wherein the select circuit selects either the first threshold voltage or a dummy analog signal, which is generated from the second and the third threshold voltages.

6. A semiconductor memory as claimed in claim 5, wherein the dummy voltage is the average of the second threshold voltage and the third threshold voltage.

7. A semiconductor memory as claimed in claim 3, wherein the plurality of memory cells include a first memory cell having a first analog signal, which is accessed to read out in a first cycle, a second memory cell having a second analog signal, which is accessed to read out in a second cycle following the first cycle, and a third memory cell having a third analog signal, which is accessed to read out in a third cycle following the second cycle, further comprising a voltage holding circuit including a select circuit and two sub-circuits;

wherein the voltage holding circuit holds a first threshold voltage of the transistor of a selected memory cell in a memory cell array at an address N at the second cycle in the first sub-circuit or holds a second threshold voltage of the transistor of the memory cell at address N at the first cycle stored in the first sub-circuit and a third threshold voltage of the transistor of the memory cell at address N+1 at the second cycle in the second sub-circuits; and wherein the select circuit selects either the first threshold voltage or a dummy analog signal, which is generated from the second and the third threshold voltages.

8. A semiconductor memory as claimed in claim 7, wherein the dummy voltage is the average of the second threshold voltage and the third threshold voltage.

9. A method for reading out data in a semiconductor memory, wherein the memory includes a plurality of memory cells, wherein each cell comprises a transistor having a floating gate and a control gate, and wherein each transistor has a predetermined threshold voltage level that is set in a range between a minimum read-out voltage level and a maximum read-out voltage level, the method comprising:

(a) applying a word line signal having a first voltage level to the control gate of the transistor of one of the cell, the first voltage level being less than the minimum read-out voltage level;

(b) sensing whether the transistor of the one of the cells is on or off;

(c) applying the word line signal having a second voltage level to the control gate of the sensed transistor if the sensed transistor is sensed to be off, the second voltage level being increased from the minimum read-out voltage level to the maximum read-out voltage level, until the transistor sensed off turns on; and (d) holding an increased second voltage level as a threshold voltage of the transistor of the one of the cell.

10. A method as claimed in claim 9, wherein the one of the cells is a first cell, the cells further comprising a second cell next to the first cell, the method further comprising:

(e) applying the word line signal having the first voltage level to the control gate of the transistor of the second cell;

(f) sensing whether the transistor of the second cell is on or off; and (g) obtaining a threshold voltage of the transistor of the second cell by using the threshold voltage of the transistor of the first cell, which was held, if the transistor of the second cell is sensed to be on.

11. A method for reading out data in a semiconductor memory, wherein the memory includes a plurality of memory cells, wherein each cell comprises a transistor having a floating gate and a control gate, and wherein each transistor has a predetermined threshold voltage level that is set in a range between a minimum-read-out voltage level and a maximum read-out voltage level, the method comprising:

(a) applying a word line signal having a first voltage level to the control gates of transistors of the memory cells, the first voltage level being less than the minimum read-out voltage level;

(b) sensing whether each transistor is on or off;

(c) applying the word line signal having a second voltage level to the control gates of the sensed transistor if the sensed transistors are sensed to be off, the second voltage level being increased from the minimum read-out voltage level to the maximum read-out voltage level, until the transistors sensed off turn on;

(d) holding each increased second voltage level as a threshold voltage of each transistor; and (e) obtaining a threshold voltage of the sensed transistor by using the threshold voltages, which are held, if the transistor is sensed to be on.

\* \* \* \* \*